US009269818B2

(12) United States Patent
Shim et al.

(10) Patent No.: US 9,269,818 B2
(45) Date of Patent: Feb. 23, 2016

(54) ARRAY SUBSTRATE FOR LIQUID CRYSTAL DISPLAY DEVICE AND METHOD FOR FABRICATING THE SAME

(71) Applicant: LG DISPLAY CO., LTD., Seoul (KR)

(72) Inventors: YuRi Shim, Gumi (KR); SungGu Kang, Gumi (KR); EuiHyun Chung, Goyang (KR); SunYong Lee, Chilgok-Gun (KR)

(73) Assignee: LG DISPLAY CO., LTD., Seoul (KR)

( * ) Notice: Subject to any disclaimer, the term of this patent is extended or adjusted under 35 U.S.C. 154(b) by 328 days.

(21) Appl. No.: 13/729,855

(22) Filed: Dec. 28, 2012

(65) Prior Publication Data

US 2014/0008656 A1    Jan. 9, 2014

(30) Foreign Application Priority Data

Jul. 4, 2012 (KR) .......................... 10-2012-0073086

(51) Int. Cl.
*H01L 29/10* (2006.01)
*H01L 29/04* (2006.01)
(Continued)

(52) U.S. Cl.
CPC .... *H01L 29/78633* (2013.01); *G02F 1/136209* (2013.01); *G02F 1/136227* (2013.01); *G02F 1/136286* (2013.01); *H01L 29/66765* (2013.01)

(58) Field of Classification Search
CPC ............................................... H01L 29/78633
USPC ............................................................ 257/59
See application file for complete search history.

(56) References Cited

U.S. PATENT DOCUMENTS 6,567,136 B1 * 5/2003 Sakuramoto et al. ........... 349/43
6,850,292 B1 * 2/2005 Murade .......................... 349/44

(Continued)

FOREIGN PATENT DOCUMENTS

| CN | 1366626 A | 8/2002 |
|----|-----------|--------|
| CN | 1444083 A | 9/2003 |
| JP | 2004-214691 | 7/2004 |

OTHER PUBLICATIONS

Extended European Search Report issued in corresponding European Patent Application No. 12008574.1, mailed Apr. 25, 2013.

(Continued)

*Primary Examiner* — Andy Huynh
*Assistant Examiner* — Sitaramarao S Yechuri
(74) *Attorney, Agent, or Firm* — Brinks Gilson & Lione

(57) ABSTRACT

An array substrate for the liquid crystal display device, the array substrate includes: a first insulating film pattern on an insulating substrate and having an opening; a first light shielding film pattern on the first insulating film pattern including the opening; a gate insulating film over the entire surface of the insulating substrate including the first light shielding film pattern; an active layer on top of the gate insulating film and overlapping the first light shielding film pattern; a pixel electrode on top of the gate insulating film to be separated from the active layer; a source electrode and a drain electrode on top of the active layer, the drain electrode being separated from the source electrode and directly connected to the pixel electrode; a passivation film over the entire surface of the insulating substrate including the source electrode and the drain electrode; a second insulating film pattern on top of the passivation film and overlapping the first light shielding film pattern; a second light shielding film pattern on the second insulating film pattern; and a plurality of divided common electrodes on top of the passivation film and overlapping the pixel electrode.

26 Claims, 21 Drawing Sheets

(51) Int. Cl.
  *H01L 29/786* (2006.01)
  *G02F 1/1362* (2006.01)
  *H01L 29/66* (2006.01)

(56) References Cited

U.S. PATENT DOCUMENTS

| 8,363,188 B2* | 1/2013 | Nam et al. ............... 349/122 |
| 2002/0057403 A1 | 5/2002 | Yasukawa et al. |
| 2004/0008295 A1* | 1/2004 | Ueda et al. ............... 349/44 |
| 2005/0088589 A1* | 4/2005 | Edwards et al. ............... 349/110 |
| 2010/0141872 A1* | 6/2010 | Paek et al. ............... 349/69 |
| 2012/0032263 A1* | 2/2012 | Nakazawa et al. ............... 257/347 |

OTHER PUBLICATIONS

Office Action dated Aug. 3, 2015 for corresponding Chinese Patent Application No. 201210590906.4, 22 pages.

* cited by examiner

ARRAY SUBSTRATE FOR LIQUID CRYSTAL DISPLAY DEVICE AND METHOD FOR FABRICATING THE SAME

CROSS-REFERENCE TO RELATED APPLICATIONS

This application claims the benefit of Korean Patent Application No. 10-2012-0073086, filed on Jul. 4, 2012, which is hereby incorporated by reference for all purposes as if fully set forth herein.

BACKGROUND

1. Field of the Disclosure

The present disclosure relates to a liquid crystal display device (hereinafter, abbreviated as LCD), and more particularly, to an array substrate for a liquid crystal display device having a light shielding film structure formed above and below a thin film transistor to block light, such as sunlight, from a high-luminance backlight, and a method for fabricating the same.

2. Background

In general, the driving principle of a liquid crystal display (LCD) device uses an optical anisotropy and polarization properties of liquid crystal. Liquid crystals have a thin, long structure, so they have orientation in an alignment of molecules, and the direction of the alignment of molecules can be controlled by intentionally applying an electric field to the liquid crystal.

Thus, when the direction of the alignment of molecules of the liquid crystal is adjusted, the alignment of molecules of the liquid crystal can be changed, and light is refracted in the direction of the molecular alignment of the liquid crystal by optical anisotropy, thus displaying image information.

Currently, an active matrix liquid crystal display (AM-LCD) (which will be referred to as an 'LCD', hereinafter) in which thin film transistors and pixel electrodes connected to the thin film transistors are arranged in a matrix form has come to prominence because of its excellent resolution and video implementation capabilities.

The LCD includes a color filter substrate (i.e., an upper substrate) on which a common electrode is formed), an array substrate (i.e., a lower substrate) on which pixel electrodes are formed, and liquid crystal filled between the upper substrate and the lower substrate. In the LCD, the common electrode and the pixel electrodes drive liquid crystal by an electric field applied vertically, having excellent characteristics of transmittance, aperture ratio, and the like.

However, the driving of liquid crystal by the electric field applied vertically is disadvantageous in that viewing angle characteristics are not good. Thus, in order to overcome the shortcomings, a method for driving liquid crystal by in-plane field has been newly proposed. The method for driving liquid crystal by in-plane field has excellent viewing angle characteristics.

Although not shown, the in-plane switching mode LCD is configured such that a color filter substrate and a thin film transistor substrate face each other, and a liquid crystal is interposed therebetween.

A thin film transistor, a common electrode, and a pixel electrode are formed on each of a plurality of pixels defined on the thin film transistor substrate. Also, the common electrode and the pixel electrode are separated to be parallel on the same substrate.

The color filter substrate includes gate lines and data lines formed on the thin film transistor substrate, a black matrix formed at portions corresponding to the crossings of the gate lines and the data lines, and color filters provided to corresponds to the pixels. The liquid crystal layer is driven by an in-plane field of the common electrode and the pixel electrode.

In the in-plane switching mode LCD configured as described above, the common electrode and the pixel electrode are formed as transparent electrodes in order to secure luminance, but only portions of both ends of the common electrode and the pixel electrode contribute to improvement of the luminance due to the distance between the common electrode and the pixel electrode in terms of design and most regions block light.

Thus, a fringe field switching (FFS) technique has been proposed to maximize the luminance improvement effect. The FFS technique precisely controls liquid crystal to eliminate a color shift and obtain high contract ratio, implementing high screen quality compared with the general in-plane switching technique.

The related art FFS mode LCD device having the merit of implementing such high screen quality will now be described with reference to FIGS. 1 and 2.

FIG. 1 is a plan view of a thin film transistor arrary substrate of the related art FFS mode LCD device.

FIG. 2 is a cross-sectional view taken along line II-II of FIG. 1, schematically illustrating the thin film transistor array substrate of the related art FFS mode LCD device.

As shown in FIGS. 1 and 2, the thin film transistor array substrate for the related art LCD device includes: a plurality of gate lines 13 extending in one direction and separated to be parallel on a transparent insulating substrate 11 and a gate electrode 13a extending from the gate lines 13; a gate insulating film 15 formed over the entire surface of the substrate including the gate electrode 13a; a plurality of data lines 21 formed on top of the gate insulating film 15 and defining pixel regions at the crossings of the gate lines 13 and the data lines 21; and a thin film transistor T provided at the crossing of the gate line 13 and the data line 21 and including the gate electrode 13a, an active layer 19 located above the gate insulating film 15, an ohmic contact layer 20, and a source electrode 21a and a drain electrode 21b separate from each other.

The gate electrode 13a is formed to cover the regions of the source electrode 21a, drain electrode 21b, and active layer 19 of the thin film transistor T, where a channel is formed.

Thus, the gate electrode 13a prevents leakage current generated in response to light 30 coming from below the substrate and vertically incident from a backlight.

Moreover, a pixel electrode 17 having a large area is disposed on the insulating substrate 11 in the pixel regions defined at the crossings of the gate lines 13 and the data lines 21, and a plurality of divided common electrodes 25 are disposed on top of the pixel electrode 17 to be separated from each other, with a passivation film 23 interposed therebetween.

The pixel electrode 17 overlaps the divided common electrodes 25, and is directly connected to the drain electrode.

According to the thus-configured thin film transistor array substrate for the related art LCD device, when a data signal is supplied to the pixel electrode 17 via the thin film transistor T, the common electrodes 25 to which a common voltage is supplied form a fringe field, making the liquid crystal molecules arranged in a horizontal direction between the substrate 11 and the color filter substrate (not shown) rotate according to dielectric anisotropy. The transmittance of light that transmits through the pixel regions vary according to the degree of rotation of the liquid crystal molecules, thus implementing gray scales.

According to the thus-configured array substrate for the related art FFS mode LCD device, the gate electrode is formed to cover the source electrode, drain electrode, and active layer regions of the thin film transistor T, where a channel is formed. As such, as shown in FIG. 2, the gate electrode prevents leakage current generated in response to light 30 coming from below the substrate and vertically incident from the backlight.

In the thin film transistor for the related art LCD device, however, the source electrode, drain electrode, and active layer regions where the channel is formed are directly exposed by light 40, such as sunlight, coming from an outside environment, whereby light scattered or reflected inside the device, including the light incident from the outside, enters the channel.

Accordingly, according to the related art, it is not possible to prevent the light 40 scattered or reflected inside the device, including the light incident from the outside, from being incident from above the thin film transistor and entering the channel. As a result, leakage current is generated, and this makes it impossible to display a proper image under the driving condition of the display device. Especially, when the channel portion of the active layer is exposed to light, it fails to function as a channel because of the generation of leakage current.

Consequently, it is not possible to control various voltages required for the driving of the LCD device, thereby lowering display performance.

SUMMARY

An array substrate for a liquid crystal display device includes: a first insulating film pattern on an insulating substrate and having an opening; a first light shielding film pattern on the first insulating film pattern including the opening; a gate insulating film disposed over the entire surface of the insulating substrate including the first light shielding film pattern; an active layer on top of the gate insulating film and overlapping the first light shielding film pattern; a pixel electrode on top of the gate insulating film to be separated from the active layer; a source electrode and a drain electrode on top of the active layer, the drain electrode being separated from the source electrode and directly connected to the pixel electrode; a passivation film over the entire surface of the insulating substrate including the source electrode and the drain electrode; a second insulating film pattern on top of the passivation film and overlapping the first light shielding film pattern; a second light shielding film pattern on the second insulating film pattern; and a plurality of divided common electrodes on top of the passivation film and overlapping the pixel electrode.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention. In the drawings.

DETAILED DESCRIPTION OF THE EXEMPLARY EMBODIMENTS

An array substrate for an FFS mode liquid crystal display device according to a preferred embodiment of the present invention will be described in detail with reference to the accompanying drawings.

Figure 1:
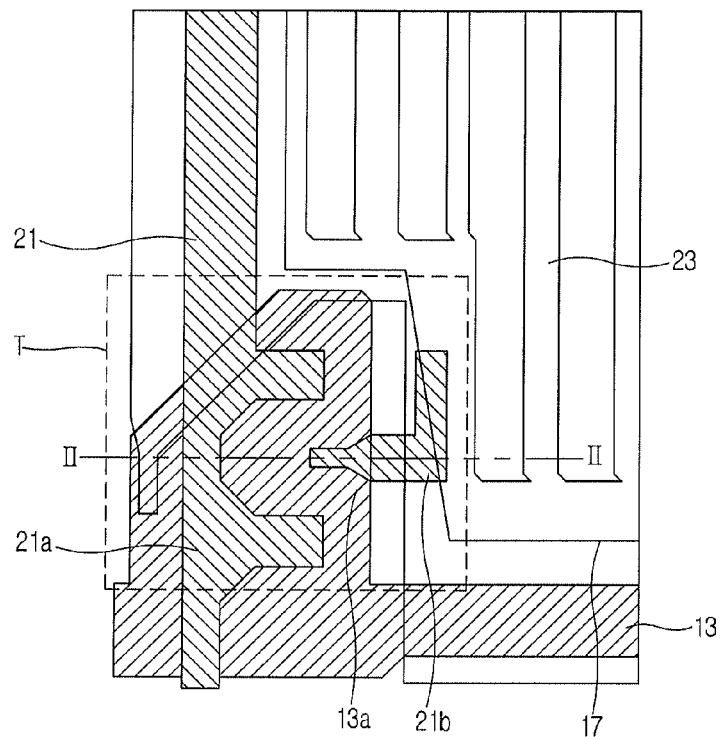
FIG. 1 is a plan view of a thin film transistor array substrate of the related art FFS mode liquid crystal display device.
Figure 2:
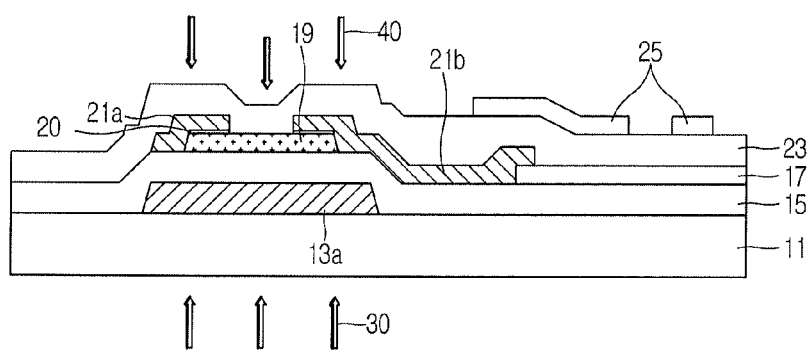
FIG. 2 is a cross-sectional view taken along line II-II of FIG. 1, schematically illustrating the thin film transistor array substrate of the related art FFS mode liquid crystal display device.
Figure 3:
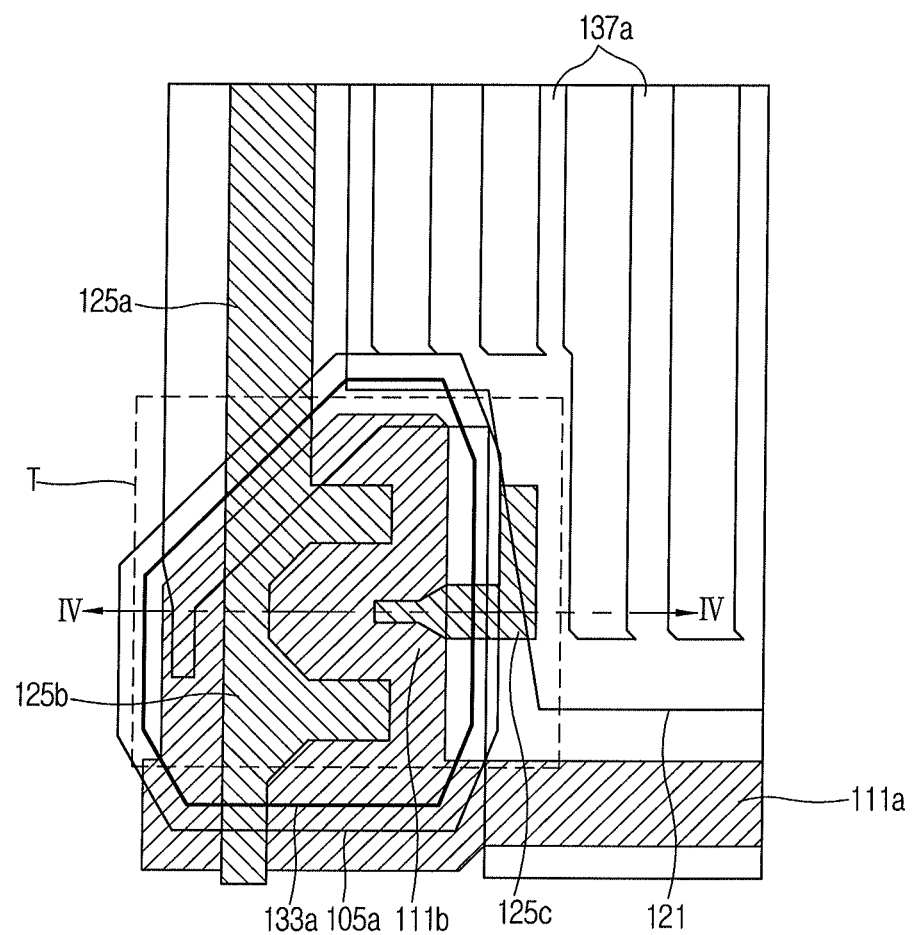
FIG. 3 is a plan view of a thin film transistor array substrate for an FFS mode liquid crystal display device according to an embodiment of the present invention.

FIG. 3 is a plan view of a thin film transistor array substrate for an FFS mode liquid crystal display device according to an embodiment of the present invention.

Figure 4:
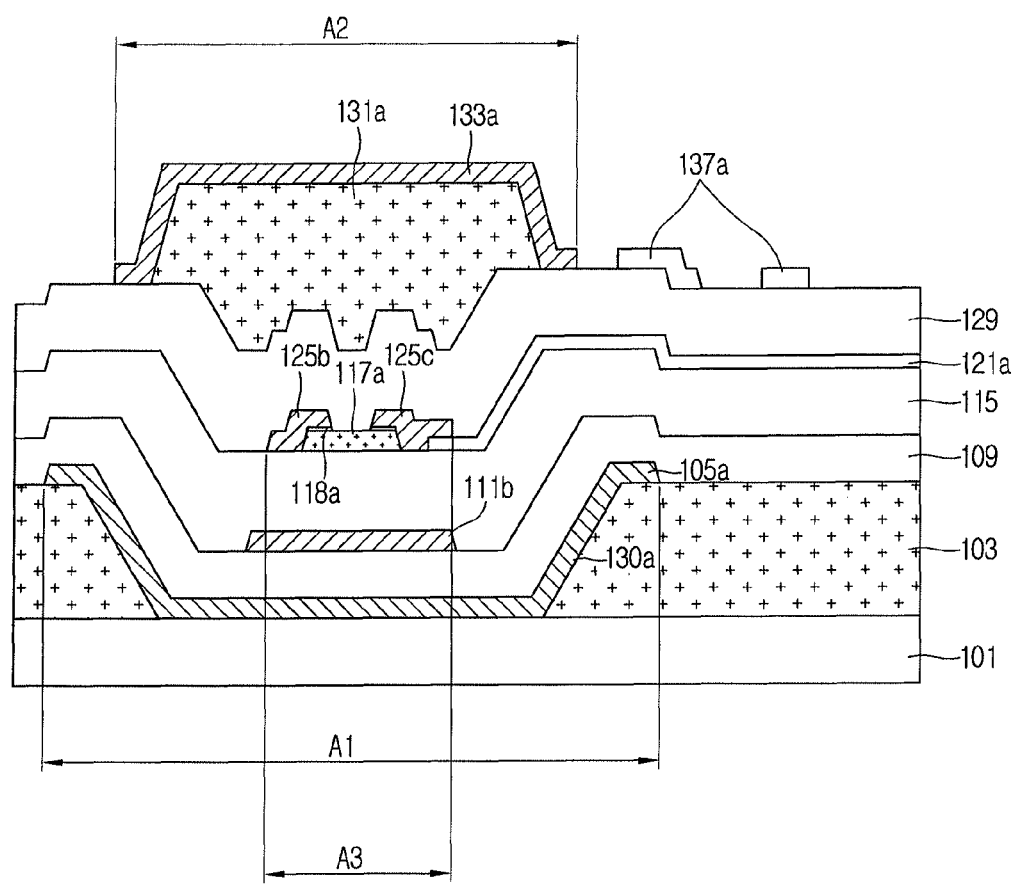
FIG. 4 is a cross-sectional view taken along line IV-IV of FIG. 3, schematically illustrating a thin film transistor array substrate for an FFS mode liquid crystal display device according to an embodiment of the present invention.

FIG. 4 is a cross-sectional view taken along line IV-IV of FIG. 3, schematically illustrating a thin film transistor array substrate for an FFS mode liquid crystal display device according to an embodiment of the present invention.

A liquid crystal display device according to the present invention maybe considered an FFS (Fringe Field Switching), IPS (In-Plane Switching), TN (Twisted Nematic), or other LCD driving mode liquid crystal display device. Here, a description will be given of an FFS mode liquid crystal display device.

An array substrate for a liquid crystal display device according to an embodiment of the present invention includes: a first insulating film 103 formed on an insulating substrate 101 and having an opening 103a; a first light shielding film pattern 105a formed on the first insulating film 103 including the opening 103a; a first gate insulating film 109 formed over the entire surface of the insulating substrate 101 including the first light shielding film pattern 105a; a gate electrode 111b formed on the first gate insulating film 109 within the opening 103a; a second gate insulating film 115 formed on the first gate insulating film 109 including the gate electrode 111b; an active layer 117a formed on top of the second gate insulating film 115 and overlapping the first light shielding film pattern 105a; a pixel electrode 121a formed on top of the second gate insulating film 115 to be separated from the active layer 117a; a source electrode 125b and a drain electrode 125c formed on top of the active layer 117a, the source electrode 125b being separated from the source electrode 125b and directly connected to the pixel electrode 121a; a passivation film 129 formed over the entire surface of the insulating substrate 101 including the source electrode 125b and the drain electrode 125c; a second insulating film pattern 131a formed on top of the passivation film 129 and overlapping the first light shielding film pattern 105a; a second light shielding film pattern 133a formed on the second insulating film pattern 131a and overlapping the first light shielding film pattern 105a; and a plurality of divided common electrodes 137a formed on top of the passivation film 129 and overlapping the pixel electrode 121a.

The first light shielding film pattern 105a may be made of at least one selected from a conductive metal group consisting of aluminum (Al), tungsten (W), copper (Cu), molybdenum (Mo), chromium (Cr), titanium (Ti), molytungsten (MoV), molytitanium (MoTi), and copper/molytitanium (Cu/MoTi). The first light shielding film pattern 105a serves to block or reflect light coming from a backlight. Also, as shown in FIG. 4, the area A1 of the first light shielding film pattern 105a is larger than the area A3 of the regions of the source electrode 125b, drain electrode 125c, and active layer 117a and the area A2 of the second light shielding film pattern 133a.

Accordingly, light entering a channel area of the thin film transistor T from the backlight can be blocked by providing the structure of the first light shielding film pattern 105a below the thin film transistor T. As a result, leakage current of the thin film transistor for the liquid crystal display device can be prevented.

Moreover, the first insulating film 103 has the opening 103a formed thereon to have a stepped portion of a given height, and is made of an organic insulating material, such as a photo soluble gate insulator (photo SGI), photo acryl (PAC), and PSG, or an inorganic insulating material. Here, an example will be given of the first insulating film 103 made of photo acryl, which is an organic insulating material. Accordingly, the structure of the first light shielding film pattern 105a is formed below the thin film transistor by using a stepped portion of the first insulating film 103, thereby blocking even reflected or scattered light.

Referring to FIG. 3, the gate electrode 111b extends vertically from a gate line 111a formed in one direction on the insulating substrate 101. The gate electrode 111b including the gate line 111a may be made of a conductive metal material, for example, at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Moreover, the pixel electrode 121a is formed over the entire surface of a pixel region of the insulating substrate 101 corresponding to the space between the gate line 111a and a data line 125a. The pixel electrode 121a may be made of any one selected from a transparent material group consisting of ITO (Indium Tin Oxide) and IZO (Indium Zinc Oxide).

Referring to FIG. 3, the source electrode 125b extends from the data line 125a perpendicularly crossing the gate line 111a formed in one direction of the insulating substrate 101, and is formed on the second gate insulating film 115 including the active layer 117a.

The drain electrode 125c is spaced apart from the source electrode 125b by a channel region, and directly connected to the pixel electrode 121a.

In this way, a thin film transistor T is formed at a point where the gate line 111a and the data line 125a perpendicularly cross each other. The thin film transistor T includes the gate electrode 111b, the second gate insulating film 115, the active layer 117a, the source electrode 125b, and the drain electrode 125c. Especially, the gate electrode 111b, the second gate insulating film 115, the active layer 117a, the source electrode 125b, and the drain electrode 125c, which constitute the thin film transistor T, overlap the opening 103a of the first insulating film 103.

The second insulating film pattern 131a overlaps the thin film transistor T, and is made of an organic insulating material, such as photo acryl, or an inorganic insulating material. Here, an example will be given of the second insulating film pattern 131a made of photo acryl, which is an organic insulating material.

As show in FIG. 4, the second light shielding film pattern 133a is formed on the second insulating film pattern 131a to overlap the thin film transistor T and the first light shielding film pattern 105a. The area A2 of the second light shielding film pattern 133a is larger than the area A3 of the thin film transistor T, for example, the source electrode 125b, drain electrode 125c, and active layer 117a, but smaller than the area A1 of the first light shielding film pattern 105a. Accordingly, the structure of the second light shielding film pattern 133a is provided above the thin film transistor T by using a stepped portion of the second insulating film pattern 131a, thereby blocking even reflected or scattered light.

The common electrodes 137a are formed to overlap the pixel electrode 121a, with the passivation film 129 interposed therebetween. The common electrodes 137a overlap the pixel electrode 121a having a large area disposed in the pixel region. The common electrodes 137a are made of any one selected from a transparent material group consisting of ITO (Indium Tin Oxide) and IZO (Indium Zinc Oxide). In the present invention, an example will be given of the common electrodes 137a made of ITO (Indium Tin Oxide).

Accordingly, the common electrodes 137a supply a reference voltage, i.e., common voltage, to each pixel in order to drive liquid crystals. The common electrodes 137a form a fringe field by overlapping the large-area pixel electrode 121a, with the passivation film 129 interposed therebetween.

Although not shown, a lower alignment film (not shown) is formed over the entire surface of the substrate including the plurality of common electrodes 137a.

A black matrix BM (not shown) is formed on a color filter substrate (not shown), which is separated from the thin film transistor array substrate, i.e., the insulating substrate 101, and is to be bonded thereto, in order to prevent light transmission into the regions excluding the pixel region.

Although not shown, color filter layers of red, green, and blue are formed in the pixel region of the color filter substrate. The black matrix is formed between the red, green, and blue color filter layers of the color filter substrate.

When bonding the color filter substrate and the insulating substrate, which is the thin film transistor substrate, the black matrix overlaps the regions excluding the pixel region of the insulating substrate 101, for example, the top parts of the thin film transistor T, gate line 111a, and data line 125a.

Although not shown, an upper alignment film (not shown) is formed on the color filter layers to align liquid crystals in a given direction.

In this way, when a data signal is supplied to the pixel electrode 121a via the thin film transistor T, a fringe field is formed between the common electrodes 137a supplied with a common voltage and the pixel electrode 121a, making the liquid crystal molecules arranged in a horizontal direction between the insulating substrate 101 and the color filter substrate rotate according to dielectric anisotropy. The transmittance of light that transmits through the pixel regions vary according to the degree of rotation of the liquid crystal molecules, thus implementing gray scales.

A method for fabricating the thus-configured array substrate for the FFS mode liquid crystal display device according to an embodiment of the present invention will now be described with reference to FIGS. 5a to 5m.

FIGS. 5a to 5m are cross-sectional views of a fabrication process of a thin film transistor array substrate for an FFS mode liquid crystal display device according to an exemplary embodiment of the present invention.

Figure 5A:
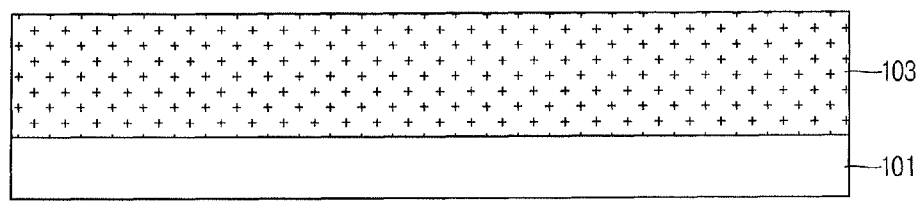
FIGS. 5a to 5m are cross-sectional views of a fabrication process of a thin film transistor array substrate for an FFS mode liquid crystal display device according to an embodiment of the present invention.

As shown in FIG. 5a, a first insulating film 103 made of a photosensitive organic insulating material, such as a photo soluble gate insulator (photo SGI), photo acryl (PAC), and PSG, or an inorganic insulating material is formed on the transparent insulating substrate 101. Here, an example will be given of the first insulating film 103 made of photo acryl, which is an organic insulating material.

Figure 5B:
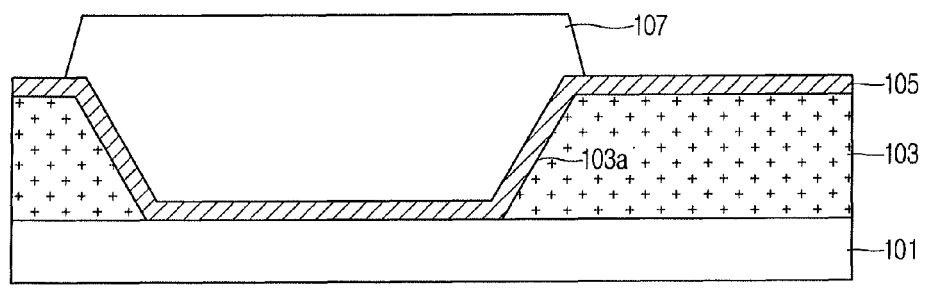

Next, as shown in FIG. 5b, the first insulating film 103 undergoes an exposure process using a first mask (not shown), and then an exposed portion of the first insulating film 103 is selectively removed by a developing process, thereby forming an opening 103a having a stepped portion of a given height.

Next, a first conductive layer 105 is deposited on top of the first insulating film 103 including the opening 103a by sputtering, and a first photosensitive film (not shown) is applied thereon. The first conductive layer 105 is made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the first photosensitive film undergoes an exposure process using a second mask (not shown), and then an exposed portion of the first photosensitive film is selectively removed by a developing process, thereby forming a first photosensitive film pattern 107.

Figure 5C:
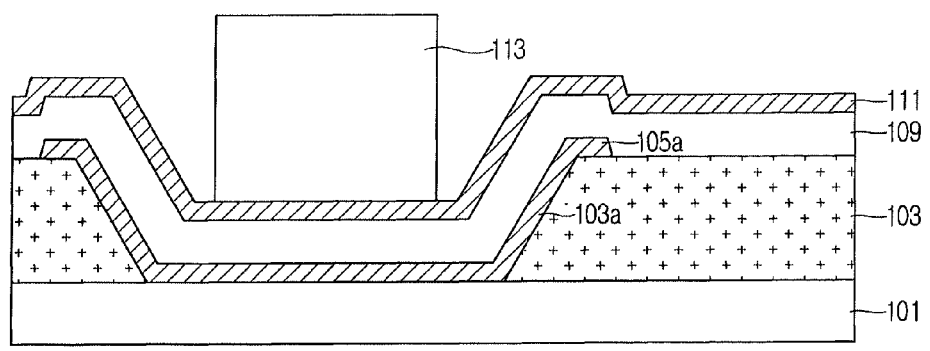

Next, as shown in FIG. 5c. the first conductive layer 105 is selectively etched by using the first photosensitive film pattern 107 as an etching mask, thereby forming a first light shielding film pattern 105a. The first light shielding film pattern 105a is formed across a top part of the first insulating film 103 including the inside of the opening 103a.

The first light shielding film pattern 105a serves to block or reflect light coming from a backlight. Also, the area of the first light shielding film pattern 105a is larger than the area of the regions of a source electrode 125b, drain electrode 125c, and active layer 117a to be formed in a subsequent process and the area of the second light shielding film pattern 133a.

Next, the first photosensitive film pattern 107 is removed, and then a first gate insulating film 109 is formed on a top part of the first insulating film 103 including the first light shielding film pattern 105a. The first gate insulating film 109 is made of any one inorganic insulating material selected from the group consisting of a silicon oxide film $SiO_2$ and a silicon nitride film.

Next, a second conductive layer 111 is deposited on top of the first gate insulating film 109 by sputtering, and then a second photosensitive film (not shown) is applied thereon. The second conductive layer 111 is made of an opaque metal material, for example, at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the second photosensitive film undergoes an exposure process using a third mask (not shown), and then an exposed portion of the second photosensitive film is selectively removed by a developing process, thereby forming a second photosensitive film pattern 113.

Figure 5D:
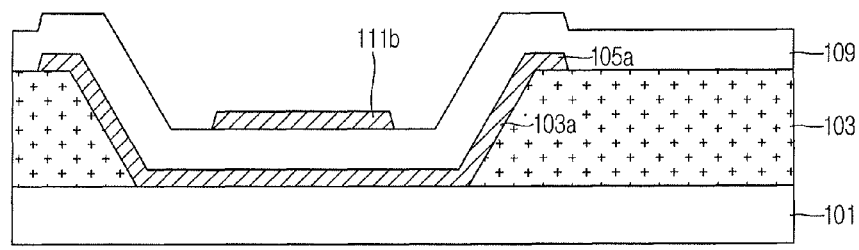

Next, as shown in FIG. 5d, the second conductive layer 111 is etched by using the second photosensitive film pattern 113 as an etching mask to thereby form a gate line 111a (see FIG. 3) and a gate electrode 111b vertically extending from the gate line 111a. The gate electrode 111b overlaps the first light shielding film pattern 105a, and is located within the opening 103a of the first insulating film 103. The area of the gate electrode 111b is smaller than the area of the first light shielding film pattern 105a.

Figure 5E:
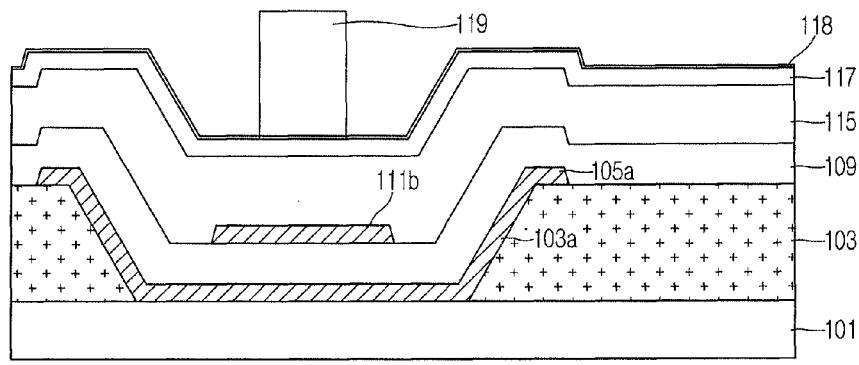

Next, as shown in FIG. 5e, the second photosensitive film pattern 113 is removed, a pure amorphous silicon layer (a-Si:H) 117 and an amorphous silicon layer (n+ or p+) 118 containing impurities, together with a second gate insulating film 115, are sequentially stacked on top of the first gate insulating film 109 including the gate electrode 111b, and then a third photosensitive film (not shown) is applied thereon. The amorphous silicon layer (a-Si:H) 117 and the amorphous silicon layer (n+ or p+) 118 containing impurities are deposited by a chemical vapor deposition (CVD) method.

Next, the third photosensitive film undergoes an exposure process using a fourth mask (not shown), and an exposed portion of the third photosensitive film is selectively removed by a developing process, thereby forming a third photosensitive film pattern 119.

Figure 5F:
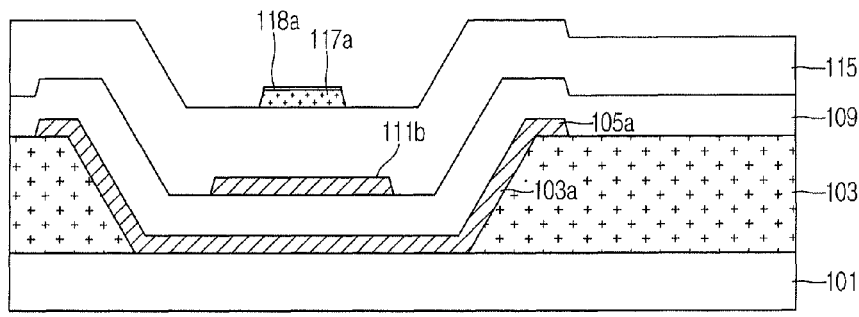

Next, as shown in FIG. 5f, the pure amorphous silicon layer (a-Si:H) 117 and the amorphous silicon layer (n+ or p+) 118 containing impurities are selectively etched by using the third photosensitive film pattern 119 as an etching mask, thereby forming an active layer 117a and an ohmic contact layer 118a on the second gate insulating film 115 above the gate electrode 111b.

Figure 5G:
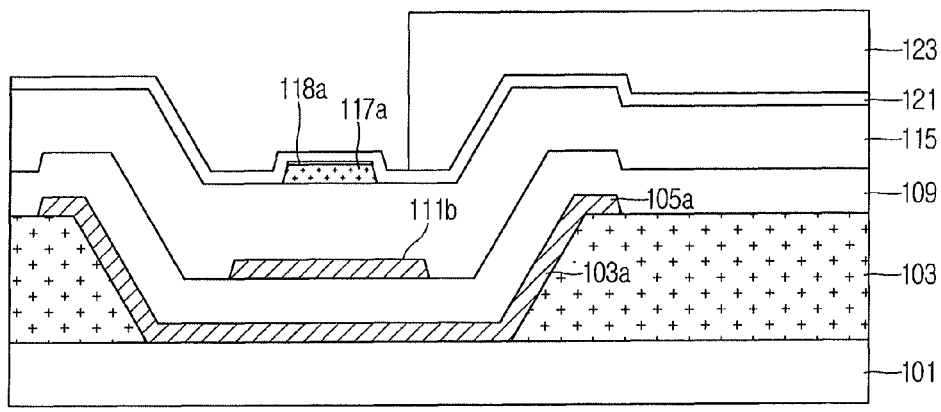

Next, as shown in FIG. 5g, the third photosensitive film pattern 119 is removed, a first transparent conductive layer 121 is deposited by sputtering on top of the second gate insulating film 115 including the active layer 117a and the ohmic contact layer 118a, and then a fourth photosensitive film (not shown) is applied thereon. The first transparent conductive layer 121 is made of any one selected from the group consisting of ITO (Indium Tin Oxide) and IZO (Indium Zinc Oxide). Here, an example will be given of the first transparent conductive layer 121 made of ITO (Indium Tin Oxide).

Next, the fourth photosensitive film undergoes an exposure process using a fifth mask (not shown), and then an exposed portion of the fourth photosensitive film is selectively removed by a developing process, thereby forming a fourth photosensitive film pattern 123.

Figure 5H:
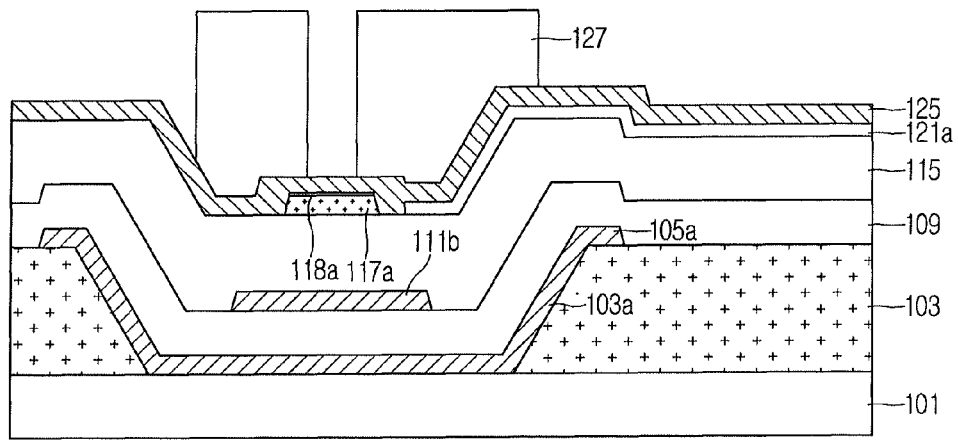

Next, as shown in FIG. 5h, the first transparent conductive layer 121 is selectively etched by using the fourth photosensitive film pattern 123 as an etching mask to thereby form a pixel electrode 121a. The pixel electrode 121a is formed over the entire surface of a pixel region of the insulating substrate 101 corresponding to the space between the gate line 111a and the data line 125a (see FIG. 3).

Next, the fourth photosensitive film pattern 123 is removed, a third conductive layer 125 is deposited by sputtering over the entire surface of the substrate including the pixel electrode 121a, and then a fifth photosensitive film (not shown) is applied thereon. The third conductive layer 125 is made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the fifth photosensitive film undergoes an exposure process using a sixth mask (not shown), and an exposed portion of the fifth photosensitive film is selectively removed by a developing process, thereby forming a fifth photosensitive film pattern 127.

Figure 5I:
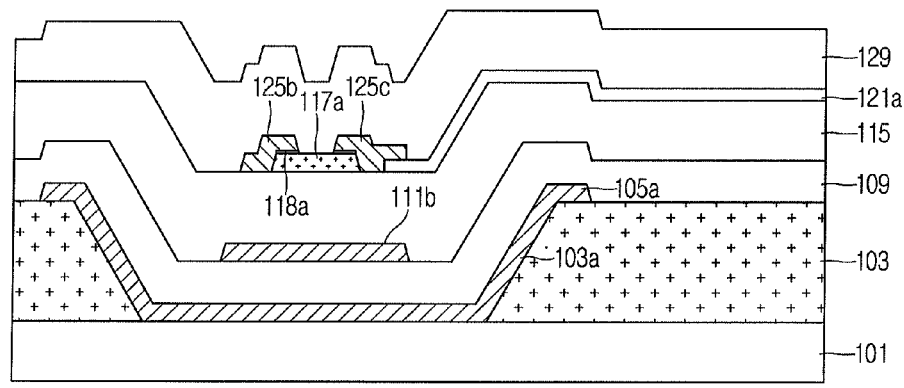

Next, as shown in FIG. 5i, the third conductive layer 125 is selectively etched by using the fifth photosensitive film pattern 127 as an etching mask to thereby form a data line 125a (see FIG. 3), a source electrode 125b extending from the data line 125a, and a drain electrode 125c spaced apart from the source electrode 125b by a channel region. After etching the third conductive layer 125, the ohmic contact layer 118a under the third conductive layer 125 is additionally etched and separated in twos. The drain electrode 125c is directly connected to the pixel electrode 121a.

In this way, a thin film transistor T is formed at a point where the gate line 111a and the data line 125a perpendicularly cross each other. The thin film transistor T includes the gate electrode 111b, the second gate insulating film 115, the active layer 117a, the source electrode 125b, and the drain electrode 125c. Especially, the gate electrode 111b, the second gate insulating film 115, the active layer 117a, the source electrode 125b, and the drain electrode 125c, which constitute the thin film transistor T, overlap the opening 103a of the first insulating film 103.

Next, the fifth photosensitive film pattern 127 is removed, and then an inorganic insulating material or organic insulating material is deposited over the entire surface of the substrate including the source electrode 125b and the drain electrode 125c, thereby forming a passivation film 129.

Figure 5J:
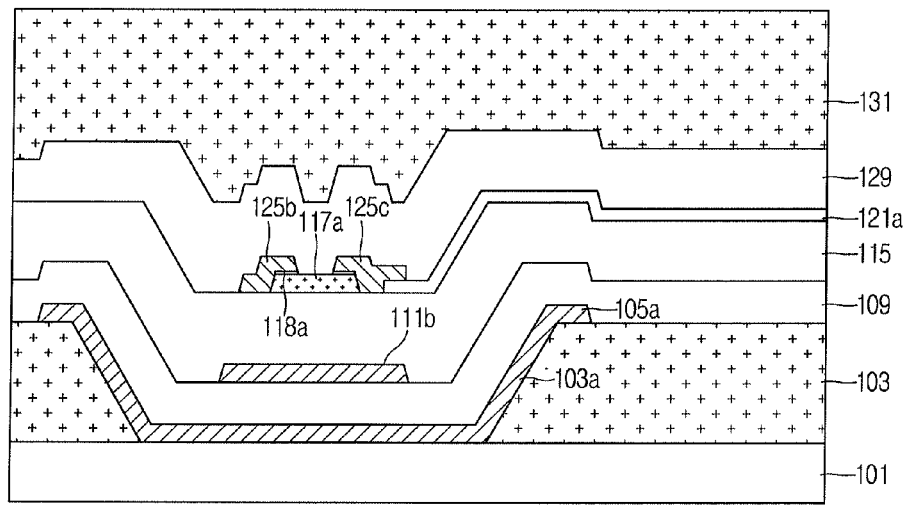

Next, as shown in FIG. 5j, a second insulating film 131 made of a photosensitive organic insulating material, such as a photo soluble gate insulator (photo SGI), photo acryl (PAC), and PSG, or an inorganic insulating material is formed on top of the passivation film 129. Here, an example will be given of the second insulating film 131 made of photo acryl, which is an organic insulating material.

Next, the second insulating film 131 undergoes an exposure process using a seventh mask (not shown), and then an exposed portion of the second insulating film 131 is selectively removed by a developing process, thereby forming a second insulating film pattern 131a. The second insulating film pattern 131a overlaps the thin film transistor T.

Figure 5K:
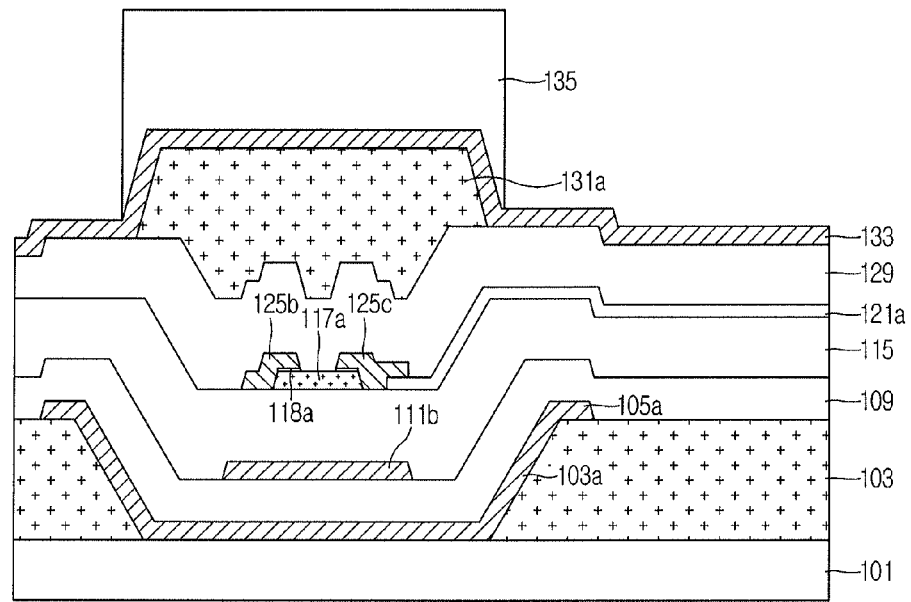

Next, as shown in FIG. 5k, a fourth conductive layer 133 is deposited on top of the passivation film 129 including the second insulating film pattern 131a by sputtering, and a sixth photosensitive film (not shown) is applied thereon. The fourth conductive layer 133 is made of an opaque metal material, for example, at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the forth photosensitive film undergoes an exposure process using an eighth mask (not shown), and then an exposed portion of the sixth photosensitive film is selectively removed by a developing process, thereby forming a sixth photosensitive film pattern 135.

Figure 5L:
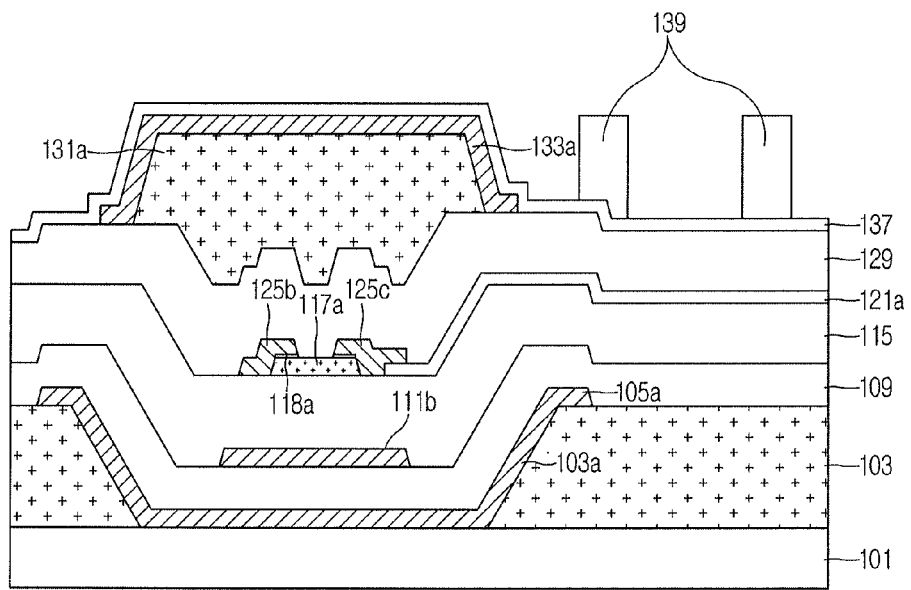

Next, as shown in FIG. 5l, the fourth conductive layer 133 is selectively etched by using the sixth photosensitive film pattern 135 as an etching mask, thereby forming a second light shielding film pattern 133a. The second light shielding film pattern 133a is formed on the second insulating film pattern 131a to overlap the thin film transistor T and the first light shielding film pattern 105a.

The area of the second light shielding film pattern 133a is larger than the area of the thin film transistor T, for example, the source electrode 125b, drain electrode 125c, and active layer 117a, but smaller than the area of the first light shielding film pattern 105a.

Accordingly, the structure of the second light shielding film pattern 133a is provided above the thin film transistor T by using a stepped portion of the second insulating film pattern 131a, thereby blocking even reflected or scattered light.

Next, the sixth photosensitive film pattern 135 is removed, a second transparent conductive layer 137 is deposited by sputtering on top of the passivation film 129 including the second light shielding film pattern 133a, and then a seventh photosensitive film (not shown) is applied thereon. The second transparent conductive layer 137 is made of any one selected from the group consisting of ITO (Indium Tin Oxide) and IZO (Indium Zinc Oxide). Here, an example will be given of the second transparent conductive layer 137 made of ITO (Indium Tin Oxide).

Next, the seventh photosensitive film undergoes an exposure process using a ninth mask (not shown), and then an exposed portion of the seventh photosensitive film is selectively removed by a developing process, thereby forming a seventh photosensitive film pattern 139.

Figure 5M:
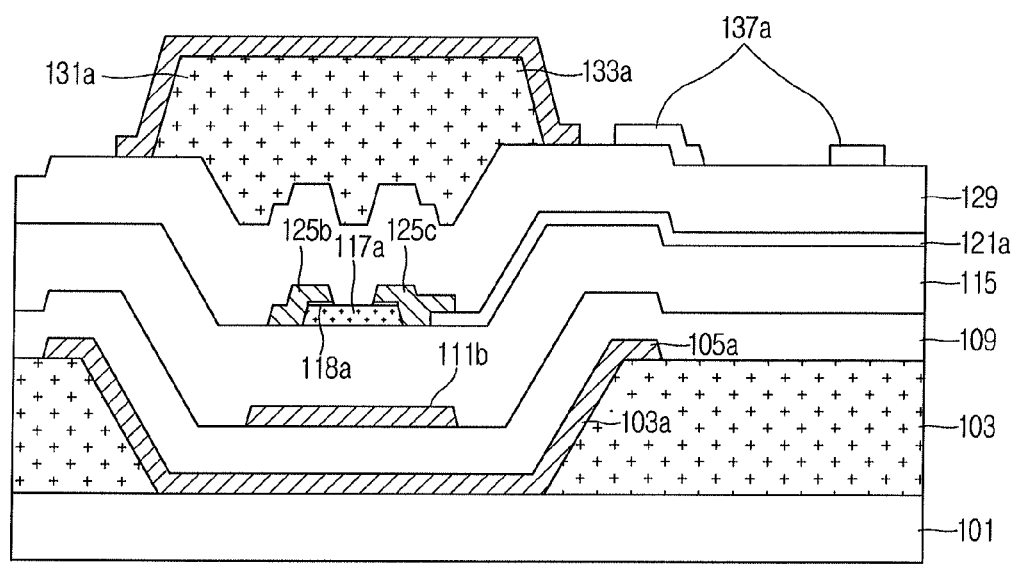

Next, as shown in FIG. 5m, the second transparent conductive layer 137 is selectively etched by using the seventh photosensitive film pattern 139 as an etching mask to thereby form a plurality of divided common electrodes 137a overlapping the pixel electrode 121a.

Accordingly, the common electrodes 137a supply a reference voltage, i.e., common voltage, to each pixel in order to drive liquid crystals. The common electrodes 137a form a fringe field by overlapping the large-area pixel electrode 121a, with the passivation film 129 interposed therebetween.

Afterwards, the seventh photosensitive film pattern 139 is removed, and then although not shown, a lower alignment film (not shown) is formed over the entire surface of the substrate including the plurality of common electrodes 137a, thereby completing the fabrication process of the thin film transistor array substrate.

A black matrix BM (not shown) is formed on a color filter substrate (not shown), which is separated from the thin film transistor array substrate, i.e., the insulating substrate 101, and is to be bonded thereto, in order to prevent light transmission into the regions excluding the pixel region.

Although not shown, color filter layers of red, green, and blue are formed in the pixel region of the color filter substrate. The black matrix is formed between the red, green, and blue color filter layers of the color filter substrate.

When bonding the color filter substrate and the insulating substrate, which is the thin film transistor substrate, the black matrix overlaps the regions excluding the pixel region of the insulating substrate 101, for example, the top parts of the thin film transistor T, gate line 111a, and data line 125a.

Although not shown, an upper alignment film (not shown) is formed on the color filter layers to align liquid crystals in a given direction, thereby completing a color filter array fabrication process.

In this way, when a data signal is supplied to the pixel electrode 121a via the thin film transistor T, a fringe field is formed between the common electrodes 137a supplied with a common voltage and the pixel electrode 121a, making the liquid crystal molecules arranged in a horizontal direction between the insulating substrate 101 and the color filter substrate rotate according to dielectric anisotropy. The transmittance of light that transmits through the pixel regions vary according to the degree of rotation of the liquid crystal molecules, thus implementing gray scales.

As discussed above, according to the array substrate for the FFS mode liquid crystal display device and the method for fabricating the same according to an embodiment of the present invention, leakage current of the thin film transistor for the liquid crystal display device can be prevented by providing a light shielding film structure above and below the thin film transistor and blocking light entering a channel area of the device. In particular, the present invention can implement the performance of a thin film transistor device by preventing sunlight and light from a high-luminance backlight from entering the channel by means of a light shielding film structure provided above and below the thin film transistor.

According to the present invention, even the light reflected in all directions that may enter the channel can be blocked by providing a light shielding film structure above and below the thin film transistor. Moreover, even reflected or scattered light can be blocked by forming a light shielding film structure using a stepped portion of an insulating film.

An array substrate for a liquid crystal display device according to another embodiment of the present invention will be described in detail with reference to the accompanying drawings.

Figure 6:
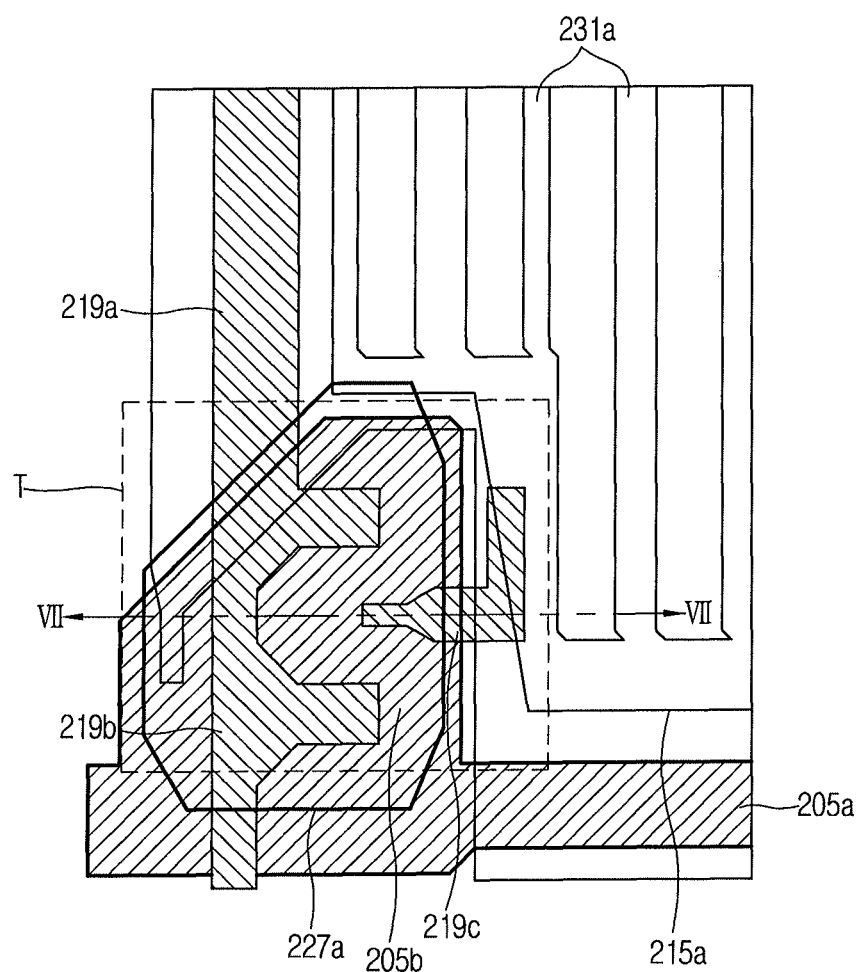
FIG. 6 is a plan view of a thin film transistor array substrate for an FFS mode liquid crystal display device according to another embodiment of the present invention.

FIG. 6 is a plan view of a thin film transistor array substrate for an FFS mode liquid crystal display device according to another embodiment of the present invention.

Figure 7:
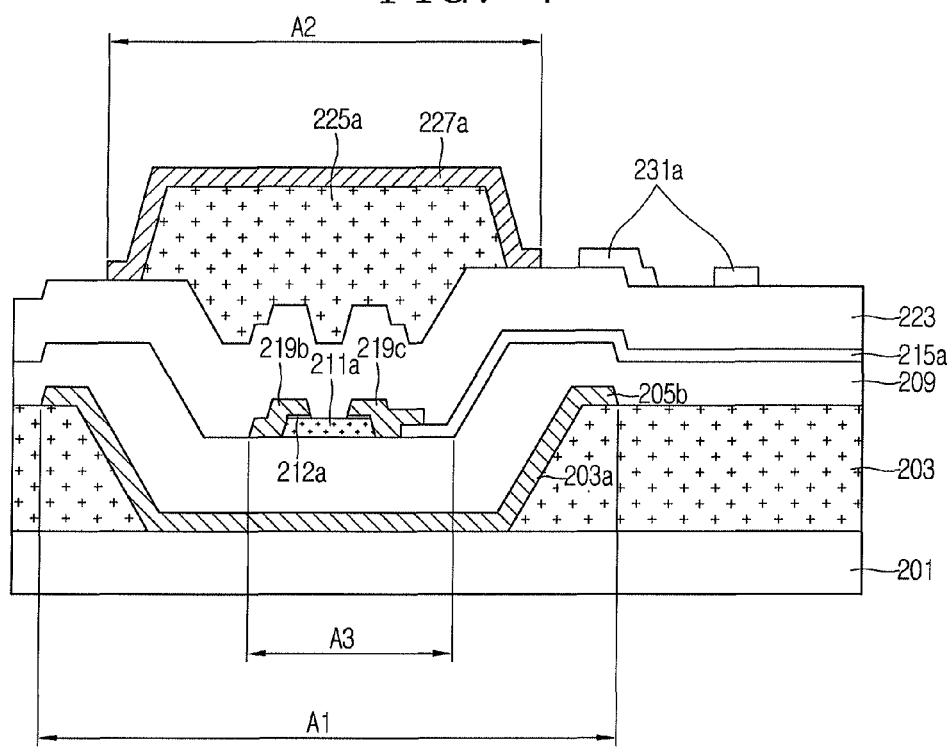
FIG. 7 is a cross-sectional view taken along line VII-VII of FIG. 6, schematically illustrating a thin film transistor array substrate for an FFS mode liquid crystal display device according to another embodiment of the present invention.

FIG. 7 is a cross-sectional view taken along line VII-VII of FIG. 6, schematically illustrating a thin film transistor array substrate for an FFS mode liquid crystal display device according to another embodiment of the present invention.

An array substrate for a liquid crystal display device according to another embodiment of the present invention includes: a first insulating film 203 formed on an insulating substrate 201 and having an opening 203a; a gate electrode 205b formed on the first insulating film 203 including the opening 203a; a gate insulating film 209 formed over the entire surface of the insulating substrate 201 including the gate electrode 205b; an active layer 211a formed on the gate insulating film 209 within the opening 203a and overlapping the gate electrode 205b; a pixel electrode 121a formed on top of the gate insulating film 209 to be separated from the active layer 211a; a source electrode 219b and a drain electrode 219c formed on top of the active layer 211a, the drain electrode 219c being separated from the source electrode 219b and directly connected to the pixel electrode 215a; a passivation film 223 formed over the entire surface of the insulating substrate 201 including the source electrode 219b and the drain electrode 219c; a second insulating film pattern 225a formed on top of the passivation film 223 and overlapping the gate electrode 205b; a light shielding film pattern 227a formed on the second insulating film pattern 225a and overlapping the gate electrode 205b; and a plurality of divided common electrodes 231a formed on top of the passivation film 223 and overlapping the pixel electrode 215a.

The gate electrode 205b extends vertically from a gate line 205a formed in one direction on the insulating substrate 201.

The gate electrode 205b may be made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi). The gate electrode 205b serves to block or reflect light coming from a backlight. Also, as shown in FIG. 7, the area A1 of the gate electrode 205b is larger than the area A3 of the regions of the source electrode 219b, drain electrode 219c, and active layer 211a and the area A2 of the light shielding film pattern 227a.

Accordingly, light entering a channel area of the thin film transistor T from the backlight can be blocked by forming the structure of the gate electrode 205b constituting the thin film transistor T across a top part including the inside of the opening 203a of the first insulating film 203. As a result, leakage current of the thin film transistor for the liquid crystal display device can be prevented.

Moreover, the first insulating film 203 has the opening 203a formed thereon to have a stepped portion of a given height, and is made of an organic insulating material, such as a photo soluble gate insulator (photo SGI), photo acryl (PAC), and PSG, or an inorganic insulating material. Here, an example will be given of the first insulating film 203 made of photo acryl, which is an organic insulating material.

Accordingly, the gate electrode 205b is formed below the active layer 211a by using a stepped portion of the first insulating film 203, thereby blocking even reflected or scattered light.

Moreover, the pixel electrode 215a is formed over the entire surface of a pixel region of the insulating substrate 201 corresponding to the space between the gate line 205a and a data line 219a. The pixel electrode 215a may be made of any one selected from a transparent material group consisting of ITO (Indium Tin Oxide) and IZO (Indium Zinc Oxide).

Referring to FIG. 6, the source electrode 215b extends from the data line 219a perpendicularly crossing the gate line 205a formed in one direction of the insulating substrate 201, and is formed on the gate insulating film 209 including the active layer 211a.

The drain electrode 219c is spaced apart from the source electrode 215b by a channel region, and directly connected to the pixel electrode 215a.

In this way, a thin film transistor T is formed at a point where the gate line 205a and the data line 219a perpendicularly cross each other. The thin film transistor T includes the gate electrode 205b, the gate insulating film 209, the active layer 211a, the source electrode 219b, and the drain electrode 219c. Especially, the gate electrode 205b, the gate insulating film 209, the active layer 211a, the source electrode 219b, and the drain electrode 219c, which constitute the thin film transistor T, overlap the opening 203a of the first insulating film 203.

The second insulating film pattern 225a overlaps the thin film transistor T, and is made of an organic insulating material, such as photo acryl, or an inorganic insulating material. Here, an example will be given of the second insulating film pattern 225a made of photo acryl, which is an organic insulating material.

The light shielding film pattern 227a is formed on the second insulating film pattern 225a to overlap the thin film transistor T and the gate electrode 205b. The area A2 of the light shielding film pattern 227a is larger than the area A3 of the thin film transistor T, for example, the source electrode 219b, drain electrode 219c, and active layer 211a, but smaller than the area Al of the gate electrode 205b.

Accordingly, the structure of the light shielding film pattern 227a is provided above the thin film transistor T by using a stepped portion of the second insulating film pattern 225a, thereby blocking even reflected or scattered light.

The common electrodes 231a are formed to overlap the pixel electrode 215a, with the passivation film 223 interposed therebetween. The common electrodes 231a overlap the pixel electrode 215a having a large area disposed in the pixel region. The common electrodes 231a are made of any one selected from a transparent material group consisting of ITO (Indium Tin Oxide) and IZO (Indium Zinc Oxide). In the present invention, an example will be given of the common electrodes 231a made of ITO (Indium Tin Oxide).

Accordingly, the common electrodes 231a supply a reference voltage, i.e., common voltage, to each pixel in order to drive liquid crystals. The common electrodes 231a form a fringe field by overlapping the large-area pixel electrode 215a, with the passivation film 223 interposed therebetween.

Although not shown, a lower alignment film (not shown) is formed over the entire surface of the substrate including the plurality of common electrodes 231a.

A black matrix BM (not shown) is formed on a color filter substrate (not shown), which is separated from the thin film transistor array substrate, i.e., the insulating substrate 201, and is to be bonded thereto, in order to prevent light transmission into the regions excluding the pixel region.

Although not shown, color filter layers of red, green, and blue are formed in the pixel region of the color filter substrate. The black matrix is formed between the red, green, and blue color filter layers of the color filter substrate.

When bonding the color filter substrate and the insulating substrate, which is the thin film transistor substrate, the black matrix overlaps the regions excluding the pixel region of the insulating substrate 201, for example, the top parts of the thin film transistor T, gate line 205a, and data line 219a.

Although not shown, an upper alignment film (not shown) is formed on the color filter layers to align liquid crystals in a given direction.

In this way, when a data signal is supplied to the pixel electrode 215a via the thin film transistor T, a fringe field is formed between the common electrodes 231a supplied with a common voltage and the pixel electrode 215a, making the liquid crystal molecules arranged in a horizontal direction between the insulating substrate 201 and the color filter substrate rotate according to dielectric anisotropy. The transmittance of light that transmits through the pixel regions vary according to the degree of rotation of the liquid crystal molecules, thus implementing gray scales.

A method for fabricating the thus-configured array substrate for the FFS mode liquid crystal display device according to another embodiment of the present invention will now be described with reference to FIGS. 8a to 8k.

FIGS. 8a to 8k are cross-sectional views of a fabrication process of a thin film transistor array substrate for an FFS mode liquid crystal display device according to another exemplary embodiment of the present invention.

Figure 8A:
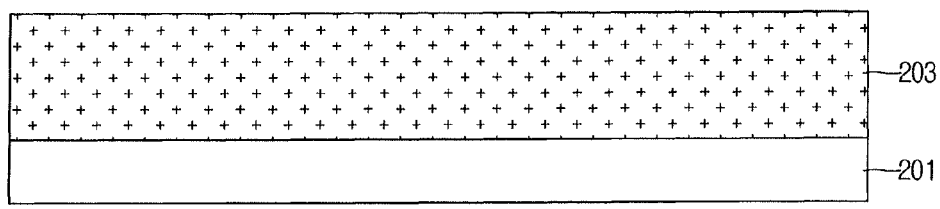
FIGS. 8a to 8k are cross-sectional views of a fabrication process of a thin film transistor array substrate for an FFS mode liquid crystal display device according to another exemplary embodiment of the present invention.

As shown in FIG. 8a, a first insulating film 203 made of a photosensitive organic insulating material, such as a photo soluble gate insulator (photo SGI), photo acryl (PAC), and PSG, or an inorganic insulating material is formed on the transparent insulating substrate 201. Here, an example will be given of the first insulating film 203 made of photo acryl, which is an organic insulating material.

Figure 8B:
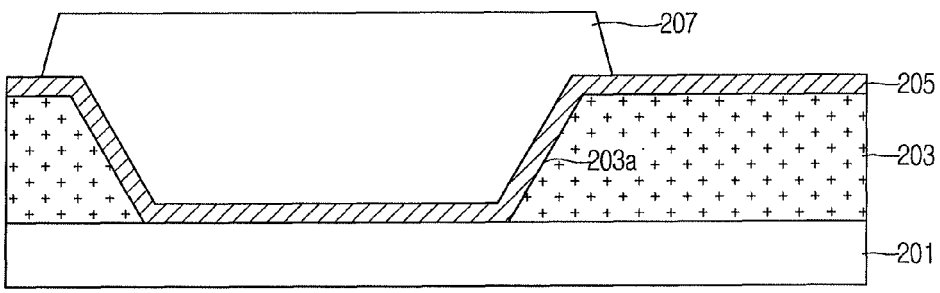

Next, as shown in FIG. 8b, the first insulating film 203 undergoes an exposure process using a first mask (not shown), and then an exposed portion of the first insulating film 203 is selectively removed by a developing process, thereby forming an opening 203a having a stepped portion of a given height.

Next, a first conductive layer 205 is deposited on top of the first insulating film 203 including the opening 203a by sputtering, and a first photosensitive film (not shown) is applied thereon. The first conductive layer 205 is made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the first photosensitive film undergoes an exposure process using a second mask (not shown), and then an exposed portion of the first photosensitive film is selectively removed by a developing process, thereby forming a first photosensitive film pattern 207.

Figure 8C:
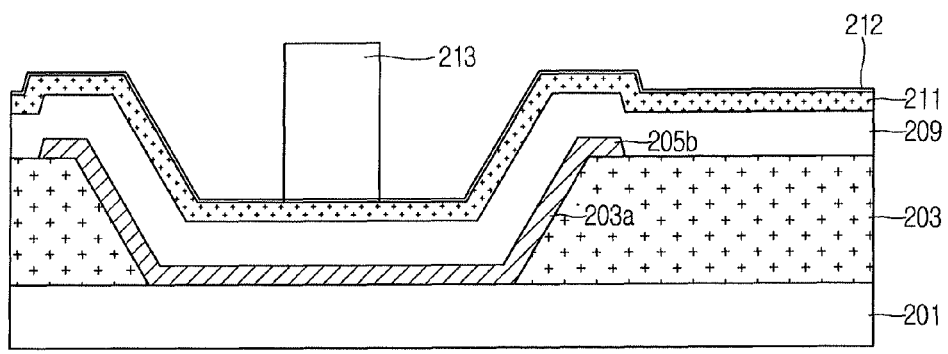

Next, as shown in FIG. 8c, the first conductive layer 205 is selectively etched by using the first photosensitive film pattern 207 as an etching mask, thereby forming a gate line 205a (see FIG. 6) and a gate electrode 205b extending vertically from the gate line 205a. The gate electrode 205b is formed across a top part of the first insulating film 203 including the inside of the opening 203a.

The gate electrode 205b serves to block or reflect light coming from a backlight. Also, the area of the gate electrode 205b is larger than the area of the regions of a source electrode 219b, drain electrode 219c, and active layer 211a to be formed in a subsequent process and the area of a light shielding film pattern 227a.

Next, the first photosensitive film pattern 207 is removed, and then a gate insulating film 209 is formed on a top part of the first insulating film 203 including the gate electrode 205b. The gate insulating film 209 is made of any one inorganic insulating material selected from the group consisting of a silicon oxide film $SiO_2$ and a silicon nitride film.

Next, as shown in FIG. 8c, a pure amorphous silicon layer (a-Si:H) 211 and an amorphous silicon layer (n+ or p+) 212 containing impurities are sequentially stacked on top of the gate insulating film 209, and then a second photosensitive film (not shown) is applied thereon. The amorphous silicon layer (a-Si:H) 211 and the amorphous silicon layer (n+ or p+) 212 containing impurities are deposited by a chemical vapor deposition (CVD) method.

Next, the second photosensitive film undergoes an exposure process using a third mask (not shown), and an exposed portion of the second photosensitive film is selectively removed by a developing process, thereby forming a second photosensitive film pattern 213.

Figure 8D:
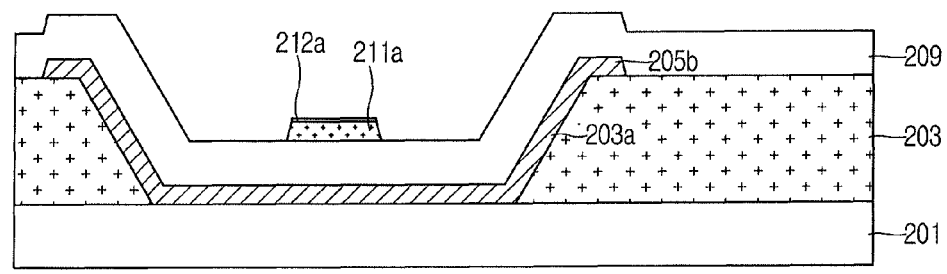

Next, as shown in FIG. 8d, the pure amorphous silicon layer (a-Si:H) 211 and the amorphous silicon layer (n+ or p+) 212 containing impurities are selectively etched by using the second photosensitive film pattern 213 as an etching mask, thereby forming an active layer 211a and an ohmic contact layer 212a on the gate insulating film 209 above the gate electrode 205b.

Figure 8E:
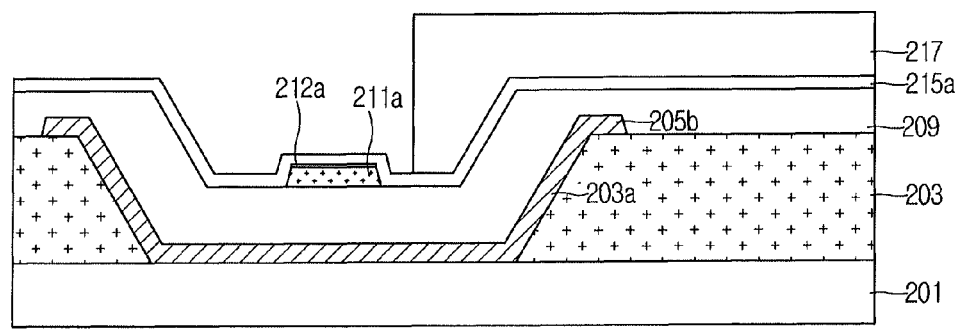

Next, as shown in FIG. 8e, the second photosensitive film pattern 213 is removed, a first transparent conductive layer 215 is deposited by sputtering on top of the gate insulating film 209 including the active layer 211a and the ohmic contact layer 212a, and then a third photosensitive film (not shown) is applied thereon. The first transparent conductive layer 215 is made of any one selected from the group consisting of ITO (Indium Tin Oxide) and IZO (Indium Zinc Oxide). Here, an example will be given of the first transparent conductive layer 215 made of ITO (Indium Tin Oxide).

Next, the third photosensitive film undergoes an exposure process using a fourth mask (not shown), and then an exposed portion of the third photosensitive film is selectively removed by a developing process, thereby forming a third photosensitive film pattern 217.

Figure 8F:
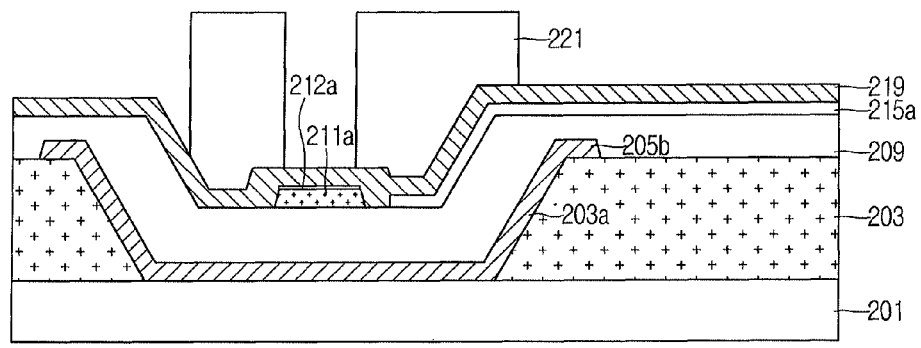

Next, as shown in FIG. 8f, the first transparent conductive layer 215 is selectively etched by using the third photosensitive film pattern 217 as an etching mask to thereby form a pixel electrode 215a. The pixel electrode 215a is formed over the entire surface of a pixel region of the insulating substrate 201 corresponding to the space between the gate line 205a (see FIG. 6) and the data line 219a (see FIG. 6).

Next, the third photosensitive film pattern 217 is removed, a second conductive layer 219 is deposited by sputtering over the entire surface of the substrate including the pixel electrode 215a, and then a fourth photosensitive film (not shown) is applied thereon. The second conductive layer 219 is made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the fourth photosensitive film undergoes an exposure process using a fifth mask (not shown), and an exposed portion of the fourth photosensitive film is selectively removed by a developing process, thereby forming a fourth photosensitive film pattern 221.

Figure 8G:
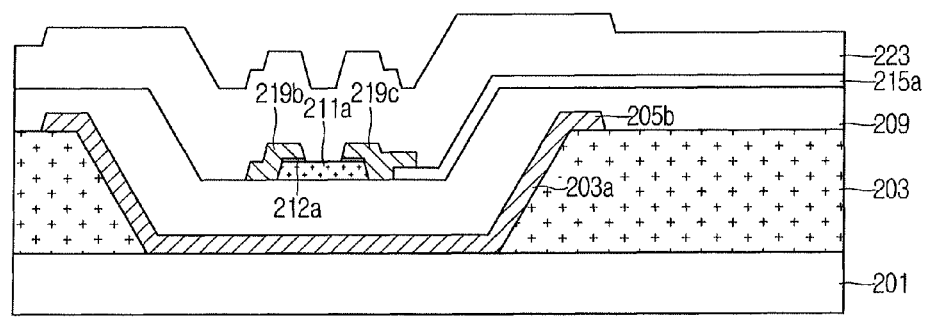

Next, as shown in FIG. 8g, the second conductive layer 219 is selectively etched by using the fourth photosensitive film pattern 221 as an etching mask to thereby form a data line 219a (see FIG. 6), a source electrode 219b extending from the data line 219a, and a drain electrode 219c spaced apart from the source electrode 219b by a channel region. After etching the second conductive layer 219, the ohmic contact layer 212a under the second conductive layer 219 is additionally etched and separated in twos. The drain electrode 219c is directly connected to the pixel electrode 215a.

In this way, a thin film transistor T is formed at a point where the gate line 205a and the data line 219a perpendicularly cross each other. The thin film transistor T includes the gate electrode 205b, the gate insulating film 209, the active layer 211a, the source electrode 219b, and the drain electrode 219c. Especially, the gate electrode 205b, the gate insulating film 209, the active layer 211a, the source electrode 219b, and the drain electrode 219c, which constitute the thin film transistor T, overlap the opening 203a of the first insulating film 203.

Next, the fourth photosensitive film pattern 221 is removed, and then an inorganic insulating material or organic insulating material is deposited over the entire surface of the substrate including the source electrode 219b and the drain electrode 219c, thereby forming a passivation film 223.

Figure 8H:
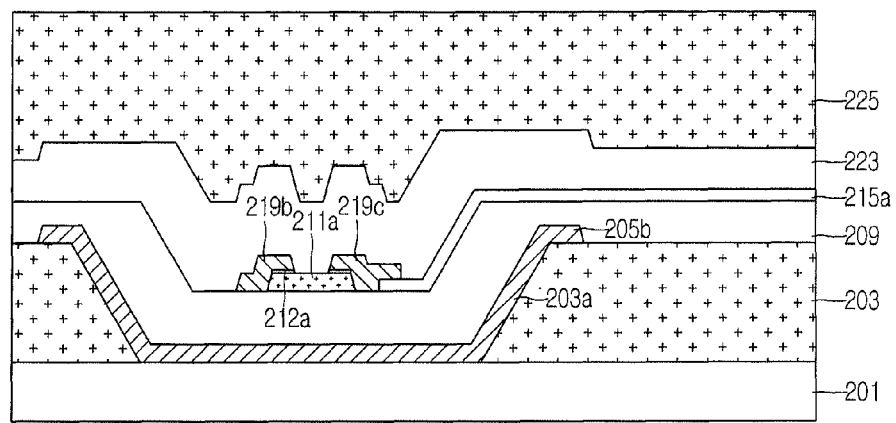

Next, as shown in FIG. 8h, a second insulating film 225 made of a photosensitive organic insulating material, such as a photo soluble gate insulator (photo SGI), photo acryl (PAC), and PSG, or an inorganic insulating material is formed on top of the passivation film 223. Here, an example will be given of the second insulating film 225 made of photo acryl, which is an organic insulating material.

Figure 8I:
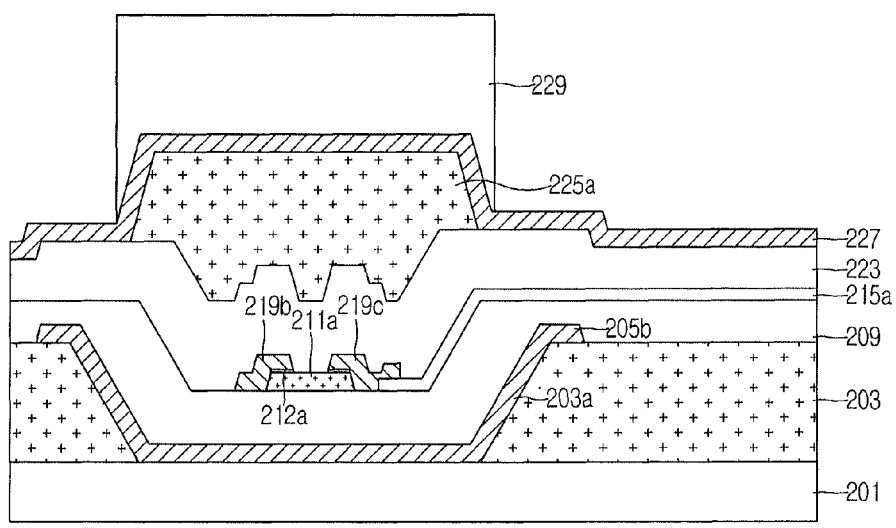

Next, as shown in FIG. 8i, the second insulating film 225 undergoes an exposure process using a sixth mask (not shown), and then an exposed portion of the second insulating film 225 is selectively removed by a developing process, thereby forming a second insulating film pattern 225a. The second insulating film pattern 225a overlaps the thin film transistor T.

Next, a third conductive layer 227 is deposited on top of the passivation film 223 including the second insulating film pattern 225a by sputtering, and a fifth photosensitive film (not shown) is applied thereon. The third conductive layer 227 is made of an opaque metal material, for example, at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the fifth photosensitive film undergoes an exposure process using a seventh mask (not shown), and then an exposed portion of the fifth photosensitive film is selectively removed by a developing process, thereby forming a fifth photosensitive film pattern 229.

Figure 8J:
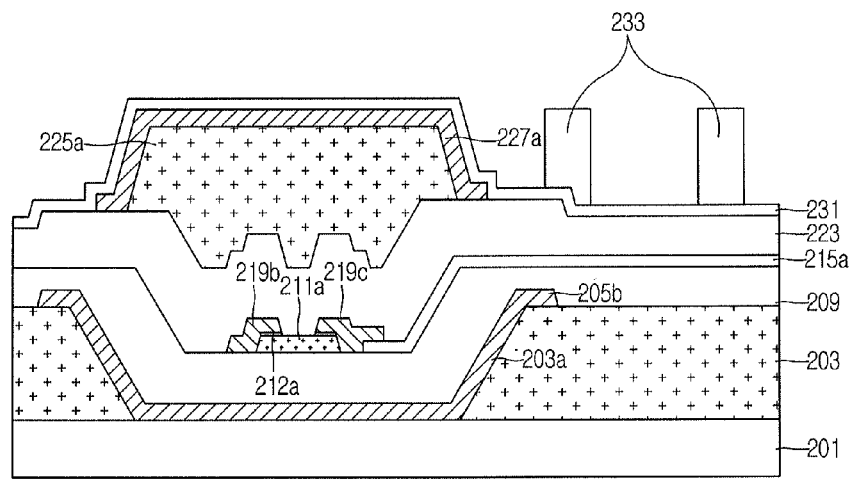

Next, as shown in FIG. 8j, the third conductive layer 227 is selectively etched by using the fifth photosensitive film pattern 229 as an etching mask, thereby forming a light shielding film pattern 227a. The light shielding film pattern 227a is formed on the second insulating film pattern 225a to overlap the thin film transistor T and the gate electrode 205b.

The area of the light shielding film pattern 227 is larger than the area of the thin film transistor T, for example, the source electrode 219b, drain electrode 219c, and active layer 211a, but smaller than the area of the gate electrode 205a.

Accordingly, the structure of the light shielding film pattern 227a is provided above the thin film transistor T by using a stepped portion of the second insulating film pattern 225a, thereby blocking even reflected or scattered light.

Next, the fifth photosensitive film pattern 229 is removed, a second transparent conductive layer 231 is deposited by sputtering on top of the passivation film 223 including the light shielding film pattern 227a, and then a sixth photosensitive film (not shown) is applied thereon. The second transparent conductive layer 231 is made of any one selected from the group consisting of ITO (Indium Tin Oxide) and IZO (Indium Zinc Oxide). Here, an example will be given of the second transparent conductive layer 231 made of ITO (Indium Tin Oxide).

Next, the sixth photosensitive film undergoes an exposure process using an eighth mask (not shown), and then an exposed portion of the sixth photosensitive film is selectively removed by a developing process, thereby forming a sixth photosensitive film pattern 233.

Figure 8K:
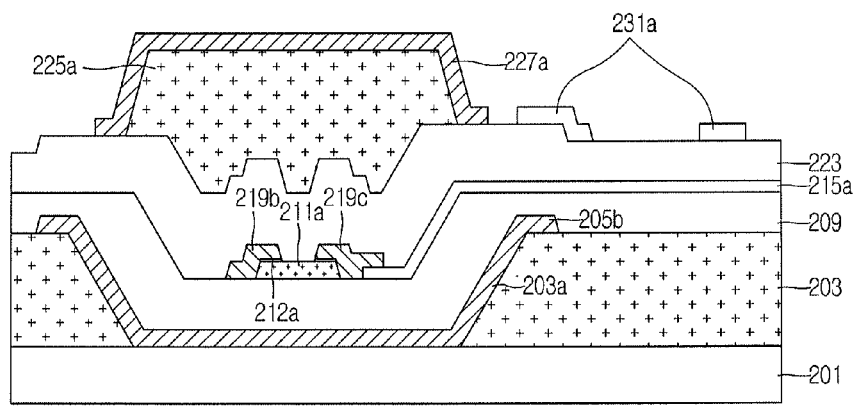

Next, as shown in FIG. 8k, the second transparent conductive layer 231 is selectively etched by using the sixth photosensitive film pattern 233 as an etching mask to thereby form a plurality of divided common electrodes 231a overlapping the pixel electrode 215a.

Accordingly, the common electrodes 231a supply a reference voltage, i.e., common voltage, to each pixel in order to drive liquid crystals. The common electrodes 231a form a fringe field by overlapping the large-area pixel electrode 215a, with the passivation film 223 interposed therebetween.

Afterwards, the sixth photosensitive film pattern 233 is removed, and then although not shown, a lower alignment film (not shown) is formed over the entire surface of the substrate including the plurality of common electrodes 231a, thereby completing the fabrication process of the thin film transistor array substrate.

A black matrix BM (not shown) is formed on a color filter substrate (not shown), which is separated from the thin film transistor array substrate, i.e., the insulating substrate 201, and is to be bonded thereto, in order to prevent light transmission into the regions excluding the pixel region.

Although not shown, color filter layers of red, green, and blue are formed in the pixel region of the color filter substrate. The black matrix is formed between the red, green, and blue color filter layers of the color filter substrate.

When bonding the color filter substrate and the insulating substrate, which is the thin film transistor substrate, the black matrix overlaps the regions excluding the pixel region of the insulating substrate 201, for example, the top parts of the thin film transistor T, gate line 205a, and data line 219a.

Although not shown, an upper alignment film (not shown) is formed on the color filter layers to align liquid crystals in a given direction, thereby completing a color filter array fabrication process.

In this way, when a data signal is supplied to the pixel electrode 215a via the thin film transistor T, a fringe field is formed between the common electrodes 231a supplied with a common voltage and the pixel electrode 215a, making the liquid crystal molecules arranged in a horizontal direction between the insulating substrate 201 and the color filter substrate rotate according to dielectric anisotropy. The transmittance of light that transmits through the pixel regions vary according to the degree of rotation of the liquid crystal molecules, thus implementing gray scales.

As discussed above, according to the array substrate for the FFS mode liquid crystal display device and the method for fabricating the same according to another embodiment of the present invention, leakage current of the thin film transistor for the liquid crystal display device can be prevented by providing a light shielding film structure above and below the thin film transistor and blocking light entering a channel area of the device. In particular, the present invention can implement the performance of a thin film transistor device by preventing sunlight and light from a high-luminance backlight from entering the channel by means of a light shielding film structure provided above and below the thin film transistor.

According to the present invention, even the light reflected in all directions that may enter the channel can be blocked by providing a light shielding film structure above and below the thin film transistor. Moreover, even reflected or scattered light can be blocked by forming a light shielding film structure using a stepped portion of an insulating film.

An array substrate for a liquid crystal display device according to yet another embodiment of the present invention will be described in detail with reference to the accompanying drawings.

Figure 9:
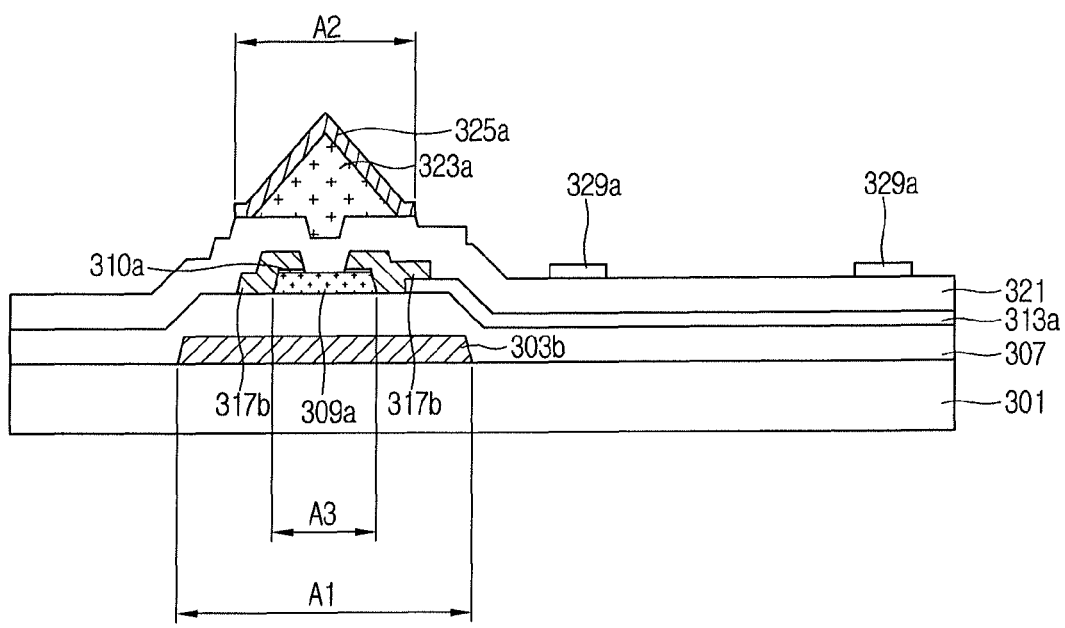
FIG. 9 is a cross-sectional view taken along line VII-VII of FIG. 6, schematically illustrating a thin film transistor array substrate for an FFS mode liquid crystal display device according to yet another embodiment of the present invention.

FIG. 9 is a cross-sectional view taken along line VII-VII of FIG. 6, schematically illustrating a thin film transistor array substrate for an FFS mode liquid crystal display device according to yet another embodiment of the present invention.

An array substrate for a liquid crystal display device according to yet another embodiment of the present invention includes: a gate electrode 303b formed on an insulating substrate 301; a gate insulating film 307 formed on the insulating substrate 301 including the gate electrode 303b; an active layer 309a formed on top of the gate insulating film 307 and overlapping the gate electrode 309b; a pixel electrode 313a formed on top of the gate insulating film 307 to be separated from the active layer 309a; a source electrode 317b and a drain electrode 317c formed on top of the active layer 309a, the source electrode 317b being separated from the source electrode 317b and directly connected to the pixel electrode 313a; a passivation film 321 formed over the entire surface of the insulating substrate 301 including the source electrode 317b and the drain electrode 317c; an insulating film pattern 323a formed on top of the passivation film 321 and overlapping the gate electrode 303b; a light shielding film pattern 325a formed on the insulating film pattern 323a and overlapping the gate electrode 303b; and a plurality of divided common electrodes 329a formed on top of the passivation film 321 and overlapping the pixel electrode 313a.

The gate electrode 303b extends vertically from a gate line (not shown) formed in one direction on the insulating substrate 301.

The gate electrode 303b may be made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi). The gate electrode 303b serves to block or reflect light coming from a backlight. Also, the area A1 of the gate electrode 303 is larger than the area A3 of the regions of the source electrode 317b, drain electrode 317c, and active layer 309a and the area A2 of the light shielding film pattern 325a.

Accordingly, light entering a channel area of the thin film transistor T from the backlight can be blocked by making the area of the structure of the gate electrode 303b constituting the thin film transistor T larger than the area of the thin film transistor T. As a result, leakage current of the thin film transistor for the liquid crystal display device can be prevented.

Moreover, the pixel electrode 313a is formed over the entire surface of a pixel region of the insulating substrate 301 corresponding to the space between the gate line (not shown) and a data line (not shown). The pixel electrode 313a may be made of any one selected from a transparent material group consisting of ITO (Indium Tin Oxide) and IZO (Indium Zinc Oxide).

The source electrode 317b extends from the data line (not shown) perpendicularly crossing the gate line (not shown) formed in one direction of the insulating substrate 301, and is formed on the gate insulating film 307 including the active layer 309a.

The drain electrode 317c is spaced apart from the source electrode 317b by a channel region, and directly connected to the pixel electrode 313a.

In this way, a thin film transistor T is formed at a point where the gate line (not shown) and the data line (not shown) perpendicularly cross each other. The thin film transistor T includes the gate electrode 303b, the gate insulating film 307, the active layer 309a, the source electrode 317b, and the drain electrode 317c. Especially, the gate electrode 303b, the gate insulating film 307, the active layer 309a, the source electrode 317b, and the drain electrode 317c, which constitute the thin film transistor T, overlap the light shielding film pattern 325a.

The insulating film pattern 323a overlaps the thin film transistor T, and is made of an organic insulating material, such as photo acryl, or an inorganic insulating material. Here, an example will be given of the insulating film pattern 323a made of photo acryl, which is an organic insulating material.

The light shielding film pattern 325a is formed on the insulating film pattern 323a to overlap the thin film transistor T and the gate electrode 303b. The area A2 of the light shielding film pattern 325a is larger than the area A3 of the thin film transistor T, for example, the source electrode 317b, drain electrode 317c, and active layer 309a, but smaller than the area A1 of the gate electrode 303b.

Accordingly, the structure of the light shielding film pattern 325a is provided above the thin film transistor T by using a stepped portion of the insulating film pattern 323a, thereby blocking even reflected or scattered light.

The divided common electrodes 329a are formed to overlap the pixel electrode 313a, with the passivation film 321 interposed therebetween. The common electrodes 329a overlap the pixel electrode 313a having a large area disposed in the pixel region. The common electrodes 329a are made of any one selected from a transparent material group consisting of ITO (Indium Tin Oxide) and IZO (Indium Zinc Oxide). In the present invention, an example will be given of the common electrodes 329a made of ITO (Indium Tin Oxide).

Accordingly, the common electrodes 329a supply a reference voltage, i.e., common voltage, to each pixel in order to drive liquid crystals. The common electrodes 329a form a fringe field by overlapping the large-area pixel electrode 313a, with the passivation film 321 interposed therebetween.

Although not shown, a lower alignment film (not shown) is formed over the entire surface of the substrate including the plurality of common electrodes 329a.

A black matrix BM (not shown) is formed on a color filter substrate (not shown), which is separated from the thin film transistor array substrate, i.e., the insulating substrate 301, and is to be bonded thereto, in order to prevent light transmission into the regions excluding the pixel region.

Although not shown, color filter layers of red, green, and blue are formed in the pixel region of the color filter substrate. The black matrix is formed between the red, green, and blue color filter layers of the color filter substrate.

When bonding the color filter substrate and the insulating substrate, which is the thin film transistor substrate, the black matrix overlaps the regions excluding the pixel region of the insulating substrate 201, for example, the top parts of the thin film transistor T, gate line (not shown), and data line (not shown).

Although not shown, an upper alignment film (not shown) is formed on the color filter layers to align liquid crystals in a given direction.

In this way, when a data signal is supplied to the pixel electrode 313a via the thin film transistor T, a fringe field is formed between the common electrodes 329a supplied with a common voltage and the pixel electrode 313a, making the liquid crystal molecules arranged in a horizontal direction between the insulating substrate 301 and the color filter substrate rotate according to dielectric anisotropy. The transmittance of light that transmits through the pixel regions vary according to the degree of rotation of the liquid crystal molecules, thus implementing gray scales.

A method for fabricating the thus-configured array substrate for the FFS mode liquid crystal display device according to yet another embodiment of the present invention will now be described with reference to FIGS. 10a to 10j.

FIGS. 10a to 10j are cross-sectional views of a fabrication process of a thin film transistor array substrate for an FFS mode liquid crystal display device according to yet another exemplary embodiment of the present invention.

Figure 10A:
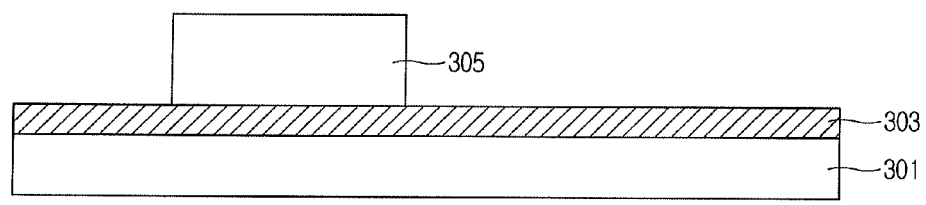
FIGS. 10a to 10j are cross-sectional views of a fabrication process of a thin film transistor array substrate for an FFS mode liquid crystal display device according to yet another exemplary embodiment of the present invention.

As shown in FIG. 10a, a first conductive layer 303 is deposited on a transparent insulating substrate 301 by sputtering, and a first photosensitive film (not shown) is applied thereon. The first conductive layer 303 is made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the first photosensitive film undergoes an exposure process using a first mask (not shown), and then an exposed portion of the first photosensitive film is selectively removed by a developing process, thereby forming a first photosensitive film pattern 305.

Figure 10B:
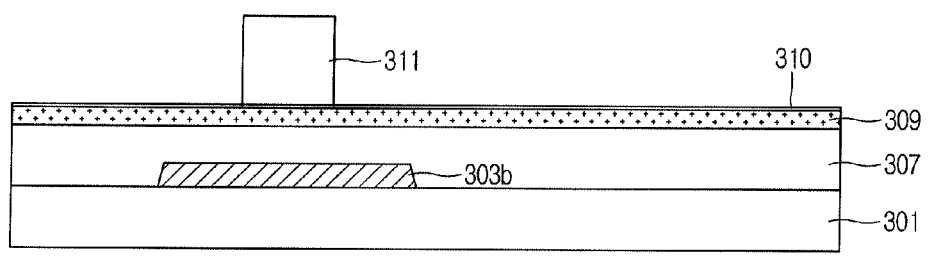

Next, as shown in FIG. 10b, the first conductive layer 303 is selectively etched by using the first photosensitive film pattern 305 as an etching mask, thereby forming a gate line (not shown) and a gate electrode 303b extending vertically from the gate line.

The gate electrode 303b serves to block or reflect light coming from a backlight. Also, the area of the gate electrode 303b is larger than the area of the regions of a source electrode 317b, drain electrode 317c, and active layer 309a to be formed in a subsequent process and the area of a light shielding film pattern 325a.

Next, the first photosensitive film pattern 305 is removed, and then a gate insulating film 307 is formed over the entire surface of the insulating substrate 301 including the gate electrode 303b. The gate insulating film 307 is made of any one inorganic insulating material selected from the group consisting of a silicon oxide film $SiO_2$ and a silicon nitride film.

Next, a pure amorphous silicon layer (a-Si:H) 309 and an amorphous silicon layer (n+ or p+) 310 containing impurities are sequentially stacked on top of the gate insulating film 307, and then a second photosensitive film (not shown) is applied thereon. The amorphous silicon layer (a-Si:H) 309 and the amorphous silicon layer (n+ or p+) 310 containing impurities are deposited by a chemical vapor deposition (CVD) method.

Next, the second photosensitive film undergoes an exposure process using a second mask (not shown), and an exposed portion of the second photosensitive film is selectively removed by a developing process, thereby forming a second photosensitive film pattern 311.

Figure 10C:
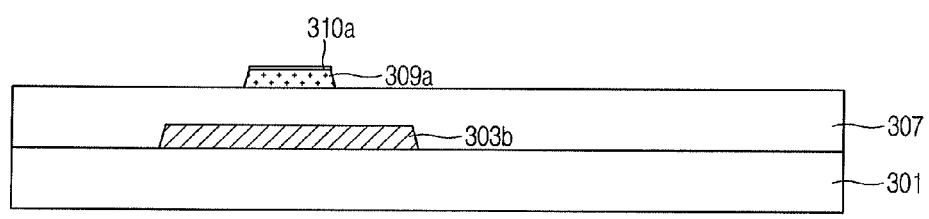

Next, as shown in FIG. 10c, the pure amorphous silicon layer (a-Si:H) 309 and the amorphous silicon layer (n+ or p+) 310 containing impurities are selectively etched by using the second photosensitive film pattern 311 as an etching mask, thereby forming an active layer 309a and an ohmic contact layer 310a on the gate insulating film 307 above the gate electrode 303b.

Figure 10D:
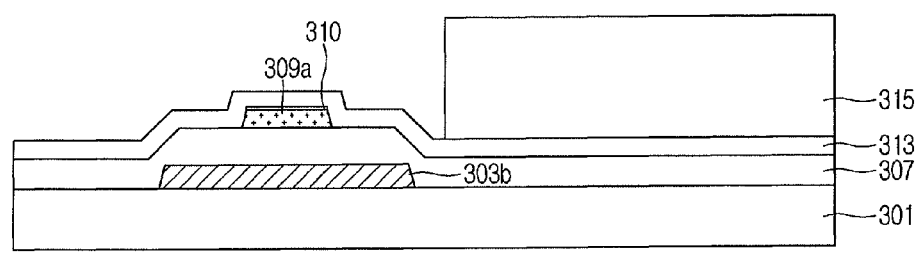

Next, as shown in FIG. 10d, the second photosensitive film pattern 311 is removed, a first transparent conductive layer 313 is deposited by sputtering on top of the gate insulating film 307 including the active layer 309a and the ohmic contact layer 310a, and then a third photosensitive film (not shown) is applied thereon. The first transparent conductive layer 313 is made of any one selected from the group consisting of ITO (Indium Tin Oxide) and IZO (Indium Zinc Oxide). Here, an example will be given of the first transparent conductive layer 313 made of ITO (Indium Tin Oxide).

Next, the third photosensitive film undergoes an exposure process using a third mask (not shown), and then an exposed portion of the third photosensitive film is selectively removed by a developing process, thereby forming a third photosensitive film pattern 315.

Figure 10E:
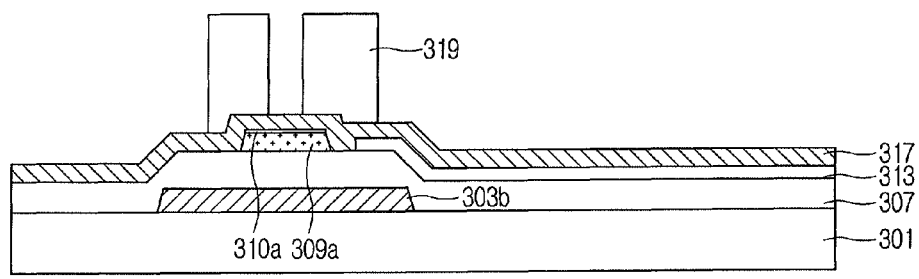

Next, as shown in FIG. 10e, the first transparent conductive layer 313 is selectively etched by using the third photosensitive film pattern 315 as an etching mask to thereby form a pixel electrode 313a. The pixel electrode 313a is formed over the entire surface of a pixel region of the insulating substrate 301 corresponding to the space between the gate line (not shown; see 205a of FIG. 6) and the data line (not shown; see 219a of FIG. 6).

Next, the third photosensitive film pattern 315 is removed, a second conductive layer 317 is deposited by sputtering over the entire surface of the substrate including the pixel electrode 313a, and then a fourth photosensitive film (not shown) is applied thereon. The second conductive layer 317 is made of at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the fourth photosensitive film undergoes an exposure process using a fourth mask (not shown), and an exposed portion of the fourth photosensitive film is selectively removed by a developing process, thereby forming a fourth photosensitive film pattern 319.

Figure 10F:
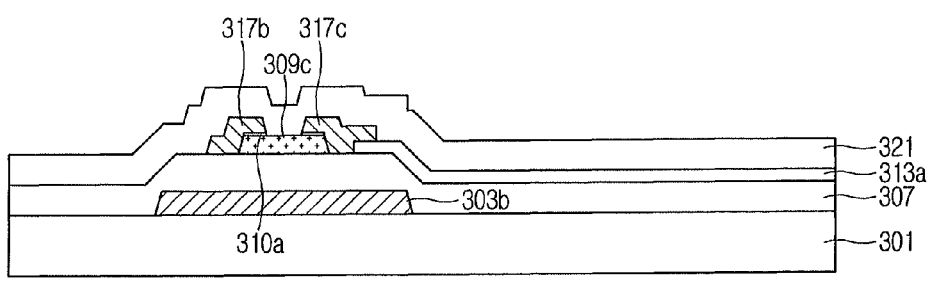

Next, as shown in FIG. 10f, the second conductive layer 317 is selectively etched by using the fourth photosensitive film pattern 319 as an etching mask to thereby form a data line (not shown; see 219a of FIG. 6), a source electrode 317b extending from the data line, and a drain electrode 317c spaced apart from the source electrode 317b by a channel region. After etching the second conductive layer 317, the ohmic contact layer 310a under the second conductive layer 317 is additionally etched and separated in twos. The drain electrode 317c is directly connected to the pixel electrode 313a.

In this way, a thin film transistor T is formed at a point where the gate line (not shown) and the data line (not shown) perpendicularly cross each other. The thin film transistor T includes the gate electrode 303b, the gate insulating film 307, the active layer 309a, the source electrode 317b, and the drain electrode 317c. Especially, the gate electrode 303b, the gate insulating film 307, the active layer 309a, the source electrode 317b, and the drain electrode 317c, which constitute the thin film transistor T, overlap the light shielding film pattern 325a.

Next, the fourth photosensitive film pattern 319 is removed, and then an inorganic insulating material or organic insulating material is deposited over the entire surface of the substrate including the source electrode 317b and the drain electrode 317c, thereby forming a passivation film 321.

Figure 10G:
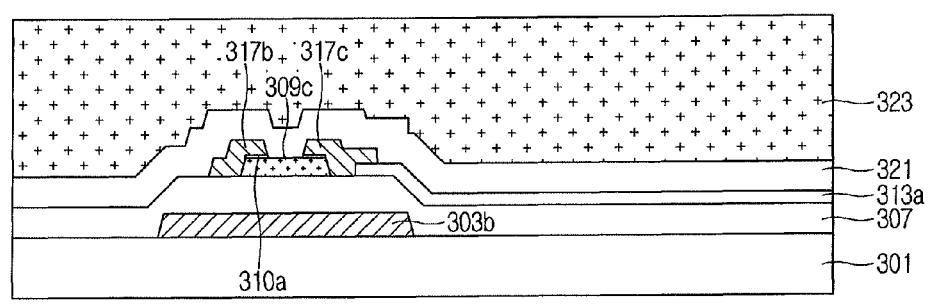

Next, as shown in FIG. 10g, an insulating film 323 made of a photosensitive organic insulating material, such as a photo soluble gate insulator (photo SGI), photo acryl (PAC), and PSG, or an inorganic insulating material is formed on top of the passivation film 321. Here, an example will be given of the insulating film 323 made of photo acryl, which is an organic insulating material.

Figure 10H:
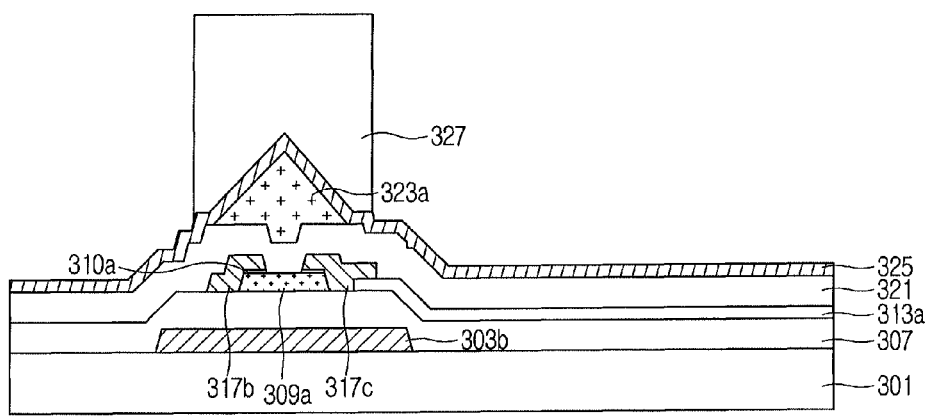

Next, as shown in FIG. 10h, the insulating film 323 undergoes an exposure process using a sixth mask (not shown), and then an exposed portion of the insulating film 323 is selectively removed by a developing process, thereby forming an insulating film pattern 323a. The insulating film pattern 323a overlaps the thin film transistor T.

Next, a third conductive layer 325 is deposited on top of the passivation film 321 including the insulating film pattern 323a by sputtering, and a fifth photosensitive film (not shown) is applied thereon. The third conductive layer 325 is made of an opaque metal material, for example, at least one selected from a conductive metal group consisting of aluminum (Al), tungsten (W), copper (Cu), molybdenum (Mo), chromium (Cr), titanium (Ti), molytungsten (MoW), molytitanium (MoTi), and copper/molytitanium (Cu/MoTi).

Next, the fifth photosensitive film undergoes an exposure process using a sixth mask (not shown), and then an exposed portion of the fifth photosensitive film is selectively removed by a developing process, thereby forming a fifth photosensitive film pattern 327.

Figure 10I:
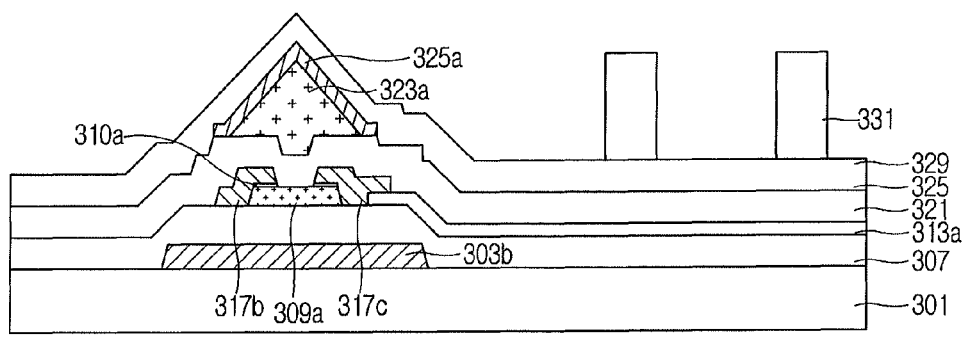

Next, as shown in FIG. 10i, the third conductive layer 325 is selectively etched by using the fifth photosensitive film pattern 327 as an etching mask, thereby forming a light shielding film pattern 325a. The light shielding film pattern 325a is formed on the insulating film pattern 323a to overlap the thin film transistor T and the gate electrode 303b.

The area of the light shielding film pattern 325a is larger than the area of the thin film transistor T, for example, the source electrode 317b, drain electrode 317c, and active layer 309a, but smaller than the area of the gate electrode 303a.

Accordingly, the structure of the light shielding film pattern 323a is provided above the thin film transistor T by using a stepped portion of the insulating film pattern 325a, thereby blocking even reflected or scattered light.

Next, the fifth photosensitive film pattern 327 is removed, a second transparent conductive layer 329 is deposited by sputtering on top of the passivation film 321 including the light shielding film pattern 325a and then a sixth photosensitive film (not shown) is applied thereon. The second transparent conductive layer 329 is made of any one selected from the group consisting of ITO (Indium Tin Oxide) and IZO (Indium Zinc Oxide). Here, an example will be given of the second transparent conductive layer 329 made of ITO (Indium Tin Oxide).

Next, the sixth photosensitive film undergoes an exposure process using a seventh mask (not shown), and then an exposed portion of the sixth photosensitive film is selectively removed by a developing process, thereby forming a sixth photosensitive film pattern 331.

Figure 10J:
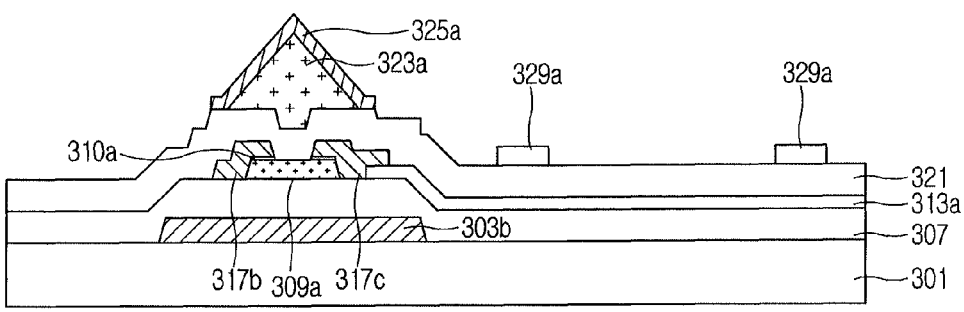

Next, as shown in FIG. 10j, the second transparent conductive layer 329 is selectively etched by using the sixth photosensitive film pattern 331 as an etching mask to thereby form a plurality of divided common electrodes 329a overlapping the pixel electrode 313a.

Accordingly, the common electrodes 329a supply a reference voltage, i.e., common voltage, to each pixel in order to drive liquid crystals. The common electrodes 329a form a fringe field by overlapping the large-area pixel electrode 313a, with the passivation film 321 interposed therebetween.

Afterwards, the sixth photosensitive film pattern 331 is removed, and then although not shown, a lower alignment film (not shown) is formed over the entire surface of the substrate including the plurality of common electrodes 329a, thereby completing the fabrication process of the thin film transistor array substrate.

A black matrix BM (not shown) is formed on a color filter substrate (not shown), which is separated from the thin film transistor array substrate, i.e., the insulating substrate 301, and is to be bonded thereto, in order to prevent light transmission into the regions excluding the pixel region.

Although not shown, color filter layers of red, green, and blue are formed in the pixel region of the color filter substrate. The black matrix is formed between the red, green, and blue color filter layers of the color filter substrate.

When bonding the color filter substrate and the insulating substrate, which is the thin film transistor substrate, the black matrix overlaps the regions excluding the pixel region of the insulating substrate 301, for example, the top parts of the thin film transistor T, gate line (not shown), and data line (not shown).

Although not shown, an upper alignment film (not shown) is formed on the color filter layers to align liquid crystals in a given direction, thereby completing a color filter array fabrication process.

In this way, when a data signal is supplied to the pixel electrode 313a via the thin film transistor T, a fringe field is formed between the common electrodes 329a supplied with a common voltage and the pixel electrode 313a, making the liquid crystal molecules arranged in a horizontal direction between the insulating substrate 301 and the color filter substrate rotate according to dielectric anisotropy. The transmittance of light that transmits through the pixel regions vary according to the degree of rotation of the liquid crystal molecules, thus implementing gray scales.

As discussed above, according to the array substrate for the FFS mode liquid crystal display device and the method for fabricating the same according to yet another embodiment of the present invention, leakage current of the thin film transistor for the liquid crystal display device can be prevented by providing a light shielding film structure above and below the thin film transistor and blocking light entering a channel area of the device. In particular, the present invention can implement the performance of a thin film transistor device by preventing sunlight and light from a high-luminance backlight from entering the channel by means of a light shielding film structure provided above and below the thin film transistor.

According to the present invention, even the light reflected in all directions that may enter the channel can be blocked by providing a light shielding film structure above and below the thin film transistor. Moreover, even reflected or scattered light can be blocked by forming a light shielding film structure using a stepped portion of an insulating film.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An array substrate for a liquid crystal display device, the array substrate comprising:
a first insulating film pattern on an insulating substrate, the first insulating film pattern having an opening and side surfaces defining the opening;
a first light shielding film pattern on the top surface of the first insulating film pattern and on the side surfaces of the opening;
a gate insulating film over the entire surface of the insulating substrate including the first light shielding film pattern;
an active layer on top of the gate insulating film and overlapping the first light shielding film pattern;
a pixel electrode on top of the gate insulating film to be separated from the active layer;
a source electrode and a drain electrode on top of the active layer, the drain electrode being separated from the source electrode and directly connected to the pixel electrode;
a passivation film over the entire surface of the insulating substrate including the source electrode and the drain electrode;
a second insulating film pattern on top of the passivation film and overlapping the first light shielding film pattern;
a second light shielding film pattern on the second insulating film pattern; and
a plurality of divided common electrodes on top of the passivation film and overlapping the pixel electrode,
wherein the first light shielding film pattern is located on the top surface of the first insulating film pattern and the top surface of the insulating substrate within the opening, and overlapped with a thin film transistor comprising the active layer, the source electrode and the drain electrode.

2. The array substrate of claim 1, wherein the first and second light shielding film patterns are made of an opaque metal material.

3. The array substrate of claim 1, wherein the first and second light shielding film patterns overlap the active layer and the source and drain electrodes.

4. The array substrate of claim 1, wherein the areas of the first and second light shielding film patterns are larger than the areas of the active layer, source electrode, and drain electrode, and the area of the first light shielding film pattern is larger than the area of the second light shielding film pattern.

5. The array substrate of claim 1, wherein the first light shielding film pattern is used as a gate electrode.

6. The array substrate of claim 1, wherein an insulating film and a gate electrode are formed between the first light shielding film pattern and the gate insulating film.

7. The array substrate of claim 1, wherein the first and second insulating film patterns are made of an organic insulating material selected from the group consisting of a photo soluble gate insulator (photo SGI), and photo acryl (PAC).

8. A method for fabricating an array substrate for a liquid crystal display device, the method comprising the steps of:

forming a first insulating film pattern having an opening on an insulating substrate, the first insulating film including side surfaces defining the opening;
forming a first light shielding film pattern on the top surface of the first insulating film pattern and on the side surfaces of the opening;
forming a gate insulating film over the entire surface of the insulating substrate including the first light shielding film pattern;
forming an active layer on top of the gate insulating film to overlap the first light shielding film pattern;
forming a pixel electrode on top of the gate insulating film to be separated from the active layer;
forming a source electrode and a drain electrode on top of the active layer, the drain electrode being separated from the source electrode and directly connected to the pixel electrode;
forming a passivation film over the entire surface of the insulating substrate including the source electrode and the drain electrode;
forming a second insulating film pattern on top of the passivation film to overlap the first light shielding film pattern;
forming a second light shielding film pattern on the second insulating film pattern; and
forming a plurality of divided common electrodes on top of the passivation film to overlap the pixel electrode,
wherein the first light shielding film pattern is located on the top surface of the first insulating film pattern and the top surface of the insulting substrate within the opening, and overlapped with a thin film transistor comprising the active layer, the source electrode and the drain electrode.

9. The method of claim 8, wherein the first and second light shielding film patterns are made of an opaque metal material.

10. The method of claim 9, wherein the first and second insulating film patterns are made of an organic insulating material selected from the group consisting of a photo soluble gate insulator (photo SGI), and photo acryl (PAC).

11. The method of claim 8, wherein the first and second light shielding film patterns overlap the active layer and the source and drain electrodes.

12. The method of claim 8, wherein the areas of the first and second light shielding film patterns are larger than the areas of the active layer, source electrode, and drain electrode, and the area of the first light shielding film pattern is larger than the area of the second light shielding film pattern.

13. The method of claim 8, wherein the first light shielding film pattern is used as a gate electrode.

14. The method of claim 8, wherein an insulating film and a gate electrode are formed between the first light shielding film pattern and the gate insulating film.

15. An array substrate for a liquid crystal display device, the array substrate comprising:
a first light shielding film pattern on an insulating substrate;
a gate insulating film over the entire surface of the insulating substrate including the first light shielding film pattern;
an active layer on top of the gate insulating film and overlapping the first light shielding film pattern;
a pixel electrode on top of the gate insulating film to be separated from the active layer;
a source electrode and a drain electrode on top of the active layer, the drain electrode being separated from the source electrode and directly connected to the pixel electrode;

a passivation film over the entire surface of the insulating substrate including the source electrode and the drain electrode;

an insulating film pattern on top of the passivation film and overlapping the first light shielding film pattern;

a second light shielding film pattern on the insulating film pattern and including opposing ends and a middle portion between the opposing ends, the middle portion being higher than the opposing ends; and a plurality of divided common electrodes on top of the passivation film and overlapping the pixel electrode, wherein the first light shielding film pattern is located on only the portion of the top surface of the insulating substrate which overlaps a thin film transistor comprising the active layer, the source electrode and the drain electrode.

16. The array substrate of claim 15, wherein the first and second light shielding film patterns are made of an opaque metal material.

17. The array substrate of claim 15, wherein the first and second light shielding film patterns overlap the active layer and the source and drain electrodes.

18. The array substrate of claim 15, wherein the areas of the first and second light shielding film patterns are larger than the areas of the active layer, source electrode, and drain electrode, and the area of the first light shielding film pattern is larger than the area of the second light shielding film pattern.

19. The array substrate of claim 15, wherein the first light shielding film pattern is used as a gate electrode.

20. The array substrate of claim 15, wherein the insulating film pattern is made of an organic insulating material selected from the group consisting of a photo soluble gate insulator (photo SGI), and photo acryl (PAC).

21. A method for fabricating an array substrate for a liquid crystal display device, the array substrate comprising the steps of:

forming a first light shielding film pattern on an insulating substrate;

forming a gate insulating film over the entire surface of the insulating substrate including the first light shielding film pattern;

forming an active layer on top of the gate insulating film to overlap the first light shielding film pattern;

forming a pixel electrode on top of the gate insulating film to be separated from the active layer;

forming a source electrode and a drain electrode on top of the active layer, the drain electrode being separated from the source electrode and directly connected to the pixel electrode;

forming a passivation film over the entire surface of the insulating substrate including the source electrode and the drain electrode;

forming an insulating film pattern on top of the passivation film to overlap the first light shielding film pattern;

forming a second light shielding film pattern on the insulating film pattern, the second light shielding film including opposing ends and a middle portion between the opposing ends, the middle portion being higher than the opposing ends; and forming a plurality of divided common electrodes on top of the passivation film to overlap the pixel electrode, wherein the first light shielding film pattern is located on only the portion of the top surface of the insulating substrate which overlaps a thin film transistor comprising the active layer, the source electrode and the drain electrode.

22. The method of claim 21, wherein the first and second light shielding film patterns are made of an opaque metal material.

23. The method of claim 21, wherein the first and second light shielding film patterns overlap the active layer and the source and drain electrodes.

24. The method of claim 21, wherein the areas of the first and second light shielding film patterns are larger than the areas of the active layer, source electrode, and drain electrode, and the area of the first light shielding film pattern is larger than the area of the second light shielding film pattern.

25. The method of claim 21, wherein the insulating film pattern is made of an organic insulating material selected from the group consisting of a photo soluble gate insulator (photo SGI), and photo acryl (PAC).

26. The method of claim 21, wherein the first light shielding film pattern is used as a gate electrode.

* * * * *